(12) United States Patent
Blomberg et al.

(10) Patent No.: US 10,643,925 B2
(45) Date of Patent: May 5, 2020

(54) FLUORINE-CONTAINING CONDUCTIVE FILMS

(71) Applicant: ASM IP HOLDING B.V., Almere (NL)

(72) Inventors: Tom E. Blomberg, Vantaa (FI); Linda Lindroos, Helsinki (FI); Hannu Huotari, Helsinki (FI)

(73) Assignee: ASM IP Holding B.V., Almere (NL)

( * ) Notice: Subject to any disclaimer, the term of this patent is extended or adjusted under 35 U.S.C. 154(b) by 504 days.

(21) Appl. No.: 14/255,799

(22) Filed: Apr. 17, 2014

(65) Prior Publication Data

US 2015/0303101 A1    Oct. 22, 2015

(51) Int. Cl.
| | |
|---|---|
| *H01L 21/44* | (2006.01) |
| *H01L 23/48* | (2006.01) |
| *H01L 21/285* | (2006.01) |
| *C23C 16/455* | (2006.01) |
| *H01L 21/768* | (2006.01) |
| *C23C 16/34* | (2006.01) |

(52) U.S. Cl.
CPC .............. *H01L 23/48* (2013.01); *C23C 16/34* (2013.01); *C23C 16/45527* (2013.01); *H01L 21/28562* (2013.01); *H01L 21/76841* (2013.01); *H01L 21/76898* (2013.01); *H01L 2924/0002* (2013.01)

(58) Field of Classification Search
CPC .............. H01L 23/48; H01L 21/76841; H01L 21/28562; H01L 2924/0002; H01L 21/76898; C23C 16/34; C23C 16/45527
USPC ........................................... 427/248.1–255.7
See application file for complete search history.

(56) References Cited

U.S. PATENT DOCUMENTS

| | | |
|---|---|---|
| 3,708,728 A | 1/1973 | Sterling et al. |
| 3,925,337 A | 12/1975 | Heiberger |
| 4,058,430 A | 11/1977 | Suntola et al. |
| 4,282,267 A | 8/1981 | Küyel |
| 4,389,973 A | 6/1983 | Suntola et al. |
| 4,565,747 A | 1/1986 | Nakae et al. |
| 4,747,367 A | 5/1988 | Posa |

(Continued)

FOREIGN PATENT DOCUMENTS

| | | |
|---|---|---|
| EP | 0387403 | 9/1990 |
| EP | 0394054 | 10/1990 |

(Continued)

OTHER PUBLICATIONS

Web Elements, https://www.webelements.com/compounds/titanium/titanium_trifluoride.html, accessed online Oct. 30, 2016.*

(Continued)

*Primary Examiner* — Michael P Wieczorek
*Assistant Examiner* — Michael G Miller
(74) *Attorney, Agent, or Firm* — Knobbe, Martens, Olson & Bear LLP

(57) ABSTRACT

An atomic layer deposition (ALD) process for depositing a fluorine-containing thin film on a substrate can include a plurality of super-cycles. Each super-cycle may include a metal fluoride sub-cycle and a reducing sub-cycle. The metal fluoride sub-cycle may include contacting the substrate with a metal fluoride. The reducing sub-cycle may include alternately and sequentially contacting the substrate with a reducing agent and a nitrogen reactant.

18 Claims, 12 Drawing Sheets

(56) References Cited

U.S. PATENT DOCUMENTS

| | | |
|---|---|---|
| 4,761,269 A | 8/1988 | Conger et al. |
| 4,767,494 A | 8/1988 | Kobayashi |
| 4,851,095 A | 7/1989 | Scobey et al. |
| 4,935,661 A | 6/1990 | Heinecke et al. |
| 5,071,670 A | 12/1991 | Kelly |
| 5,166,092 A | 11/1992 | Mochizuki et al. |
| 5,221,556 A | 6/1993 | Hawkins et al. |
| 5,270,247 A | 12/1993 | Sakuma et al. |
| 5,281,274 A | 1/1994 | Yoder |
| 5,306,666 A | 4/1994 | Izumi |
| 5,316,793 A | 5/1994 | Wallace et al. |
| 5,342,652 A | 8/1994 | Foster et al. |
| 5,482,262 A | 1/1996 | Hayakawa et al. |
| 5,482,570 A | 1/1996 | Saurer et al. |
| 5,595,784 A | 1/1997 | Kaim et al. |
| 5,603,771 A | 2/1997 | Seiberras et al. |
| 5,618,395 A | 4/1997 | Gartner |
| 5,691,235 A | 11/1997 | Meikle et al. |
| 5,693,139 A | 12/1997 | Nishizawa et al. |
| 5,711,811 A | 1/1998 | Suntola et al. |
| 5,723,384 A | 3/1998 | Park et al. |
| 5,744,254 A | 4/1998 | Kampe et al. |
| 5,769,950 A | 6/1998 | Takasu et al. |
| 5,789,024 A | 8/1998 | Levy et al. |
| 5,855,680 A | 1/1999 | Soininen |
| 5,916,365 A | 6/1999 | Sherman |
| 5,946,598 A | 8/1999 | Yeh |
| 5,947,710 A | 9/1999 | Cooper et al. |
| 5,964,943 A | 10/1999 | Stein et al. |
| 5,965,004 A | 10/1999 | Cowley et al. |
| 5,972,430 A | 10/1999 | DiMeo et al. |
| 5,973,400 A | 10/1999 | Murakami et al. |
| 6,006,793 A | 12/1999 | Mori et al. |
| 6,015,590 A | 1/2000 | Suntola et al. |
| 6,087,257 A | 7/2000 | Park et al. |
| 6,099,904 A | 8/2000 | Mak et al. |
| 6,104,074 A | 8/2000 | Chen |
| 6,113,977 A | 9/2000 | Soininen et al. |
| 6,124,158 A | 9/2000 | Dautartas et al. |
| 6,139,624 A | 10/2000 | Rupp |
| 6,139,700 A | 10/2000 | Kang et al. |
| 6,144,060 A | 11/2000 | Park et al. |
| 6,156,382 A | 12/2000 | Rajagopalan et al. |
| 6,162,501 A | 12/2000 | Kim |
| 6,174,809 B1 | 1/2001 | Kang et al. |
| 6,188,134 B1 | 2/2001 | Stumborg et al. |
| 6,194,310 B1 | 2/2001 | Hsu et al. |
| 6,200,389 B1 | 3/2001 | Miller et al. |
| 6,203,613 B1 | 3/2001 | Gates et al. |
| 6,206,967 B1 | 3/2001 | Mak et al. |
| 6,234,646 B1 | 5/2001 | Ito |
| 6,270,572 B1 | 8/2001 | Kim et al. |
| 6,284,646 B1 | 9/2001 | Leem |
| 6,287,965 B1 | 9/2001 | Kang et al. |
| 6,342,277 B1 | 1/2002 | Sherman |
| 6,355,561 B1 | 3/2002 | Sandhu et al. |
| 6,380,627 B1 | 4/2002 | Weihs et al. |
| 6,391,785 B1 | 5/2002 | Satta et al. |
| 6,416,577 B1 | 7/2002 | Suntola et al. |
| 6,464,779 B1 | 10/2002 | Powell et al. |
| 6,475,276 B1 | 11/2002 | Elers et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers |
| 6,534,395 B2 | 3/2003 | Werkhoven et al. |
| 6,576,053 B1 | 6/2003 | Kim et al. |
| 6,599,572 B2 | 7/2003 | Saanila et al. |
| 6,613,383 B1 | 9/2003 | George et al. |
| 6,616,982 B2 | 9/2003 | Merrill et al. |
| 6,632,595 B2 | 10/2003 | Kikuchi et al. |
| 6,652,924 B2 | 11/2003 | Sherman |
| 6,706,115 B2 | 3/2004 | Leskela et al. |
| 6,727,169 B1 | 4/2004 | Raaijmakers et al. |
| 6,780,704 B1 | 8/2004 | Raaijmakers et al. |
| 6,794,287 B2 | 9/2004 | Saanila et al. |
| 6,797,340 B2 | 9/2004 | Fang et al. |
| 6,800,383 B1 | 10/2004 | Lakhotkin |
| 6,800,552 B2 | 10/2004 | Elers et al. |
| 6,809,026 B2 | 10/2004 | Yoon et al. |
| 6,821,889 B2 | 11/2004 | Elers et al. |
| 6,827,978 B2 | 12/2004 | Yoon et al. |
| 6,833,161 B2 | 12/2004 | Wang et al. |
| 6,838,816 B2 | 1/2005 | Su et al. |
| 6,863,727 B1 | 3/2005 | Elers et al. |
| 6,902,763 B1 | 6/2005 | Elers et al. |
| 6,986,914 B2 | 1/2006 | Elers et al. |
| 7,015,153 B1 | 3/2006 | Triyoso et al. |
| 7,045,406 B2 | 5/2006 | Huotari et al. |
| 7,138,336 B2 | 11/2006 | Lee et al. |
| 7,211,144 B2 | 5/2007 | Lu et al. |
| 7,211,508 B2 | 5/2007 | Chung et al. |
| 7,268,078 B2 | 9/2007 | Iyer |
| 7,279,432 B2 | 10/2007 | Xi et al. |
| 7,405,158 B2 | 7/2008 | Lai et al. |
| 7,416,981 B2 | 8/2008 | Lee et al. |
| 7,598,170 B2 | 10/2009 | Elers |
| 7,794,798 B2 | 9/2010 | Hautala |
| 7,851,307 B2 | 12/2010 | Ramaswamy et al. |
| 7,867,557 B2 | 1/2011 | Pickett et al. |
| 8,054,669 B2 | 11/2011 | Meijer et al. |
| 9,412,602 B2 | 8/2016 | Blomberg et al. |
| 2001/0024387 A1 | 9/2001 | Raaijmakers et al. |
| 2001/0034097 A1 | 10/2001 | Lim et al. |
| 2001/0041250 A1 | 11/2001 | Werkhoven et al. |
| 2002/0004293 A1 | 1/2002 | Soininen et al. |
| 2002/0104481 A1 | 8/2002 | Chiang et al. |
| 2002/0182320 A1 | 12/2002 | Leskela et al. |
| 2003/0026989 A1 | 2/2003 | George et al. |
| 2003/0031793 A1 | 2/2003 | Chang et al. |
| 2003/0049931 A1 | 3/2003 | Byun et al. |
| 2003/0054628 A1 | 3/2003 | Leng et al. |
| 2003/0072975 A1 | 4/2003 | Shero et al. |
| 2003/0082296 A1 | 5/2003 | Elers et al. |
| 2003/0104126 A1 | 6/2003 | Fang et al. |
| 2003/0123216 A1 | 7/2003 | Yoon et al. |
| 2003/0127043 A1 | 7/2003 | Lu et al. |
| 2003/0153181 A1 | 8/2003 | Yoon et al. |
| 2003/0157760 A1 | 8/2003 | Xi et al. |
| 2003/0161952 A1 | 8/2003 | Wang et al. |
| 2003/0181035 A1 | 9/2003 | Yoon et al. |
| 2003/0194825 A1 | 10/2003 | Law et al. |
| 2003/0203616 A1 | 10/2003 | Chung et al. |
| 2003/0207593 A1* | 11/2003 | Derderian ............ C23C 16/452 438/778 |
| 2004/0130029 A1 | 7/2004 | Raaijmakers et al. |
| 2004/0185183 A1 | 9/2004 | Srinivasan et al. |
| 2004/0206008 A1 | 10/2004 | Sung |
| 2004/0208994 A1 | 10/2004 | Harkonen et al. |
| 2004/0224504 A1 | 11/2004 | Gadgil |
| 2004/0231799 A1 | 11/2004 | Lee et al. |
| 2004/0238876 A1 | 12/2004 | Youn et al. |
| 2005/0037557 A1 | 2/2005 | Doczy et al. |
| 2005/0106877 A1 | 5/2005 | Elers et al. |
| 2005/0215008 A1 | 9/2005 | Orlowski et al. |
| 2005/0271813 A1 | 12/2005 | Kher et al. |
| 2006/0019494 A1 | 1/2006 | Cao et al. |
| 2006/0049931 A1 | 3/2006 | Sugimura |
| 2006/0078679 A1 | 4/2006 | Elers et al. |
| 2006/0079090 A1 | 4/2006 | Elers et al. |
| 2006/0165892 A1 | 7/2006 | Weidman |
| 2006/0211224 A1 | 9/2006 | Matsuda et al. |
| 2006/0223300 A1 | 10/2006 | Simka et al. |
| 2006/0240187 A1 | 10/2006 | Weidman |
| 2007/0004186 A1 | 1/2007 | Yoshii et al. |
| 2007/0026671 A1 | 2/2007 | Kim et al. |
| 2007/0054046 A1 | 3/2007 | Ishizaka et al. |
| 2007/0148350 A1 | 6/2007 | Rahtu et al. |
| 2007/0218670 A1 | 9/2007 | Ishizaka |
| 2008/0102204 A1 | 5/2008 | Elers |
| 2008/0113110 A1 | 5/2008 | Elers et al. |
| 2008/0182411 A1 | 7/2008 | Elers |
| 2008/0274617 A1 | 11/2008 | Milligan |
| 2009/0081868 A1 | 3/2009 | Shah et al. |

(56) References Cited

U.S. PATENT DOCUMENTS

| | | | |
|---|---|---|---|
| 2009/0140384 A1* | 6/2009 | Bouche | B82Y 25/00 257/531 |
| 2009/0152620 A1 | 6/2009 | Ahn et al. | |
| 2009/0211526 A1 | 8/2009 | Tanaka et al. | |
| 2009/0315093 A1 | 12/2009 | Li et al. | |
| 2011/0111298 A1* | 5/2011 | Lopez | H01M 4/131 429/221 |
| 2012/0269962 A1 | 10/2012 | Blomberg et al. | |
| 2013/0078454 A1 | 3/2013 | Thompson et al. | |
| 2013/0126815 A1 | 5/2013 | Kim et al. | |
| 2014/0162127 A1* | 6/2014 | Kim | H01M 4/366 429/224 |
| 2014/0273452 A1* | 9/2014 | Blomberg | H01L 21/28562 438/680 |

FOREIGN PATENT DOCUMENTS

| | | |
|---|---|---|
| EP | 0442490 | 8/1991 |
| EP | 0526779 | 2/1993 |
| EP | 0528779 | 2/1993 |
| EP | 0573033 | 12/1993 |
| EP | 0774533 | 5/1997 |
| EP | 0899779 | 3/1999 |
| EP | 1 158 070 | 11/2001 |
| EP | 1167567 | 1/2002 |
| JP | 58033841 | 2/1983 |
| JP | 6037041 | 2/1994 |
| JP | 6069157 | 3/1994 |
| JP | 7230957 | 8/1995 |
| JP | 8264530 | 10/1996 |
| JP | 09-087857 | 3/1997 |
| KR | 2003-0016346 | 2/2003 |
| KR | 2003-0057938 | 7/2003 |
| KR | 2003-0093575 | 12/2003 |
| KR | 2004-0060402 | 7/2004 |
| KR | 2004-0079173 | 9/2004 |
| KR | 2004-0079175 | 9/2004 |
| KR | 2004-0100767 | 12/2004 |
| KR | 2005-0000168 | 1/2005 |
| WO | WO 96/17107 | 6/1996 |
| WO | WO 96/018756 | 6/1996 |
| WO | WO 98/051838 | 11/1998 |
| WO | WO 99/037655 | 7/1999 |
| WO | WO 00/001006 | 1/2000 |
| WO | WO 00/004704 | 1/2000 |
| WO | WO 00/040772 | 7/2000 |
| WO | WO 00/047404 | 8/2000 |
| WO | WO 00/047796 | 8/2000 |
| WO | WO 00/054320 | 9/2000 |
| WO | WO 00/55895 | 9/2000 |
| WO | WO 00/063957 | 10/2000 |
| WO | WO 01/027347 | 4/2001 |
| WO | WO 01/029280 | 4/2001 |
| WO | WO 01/029891 | 4/2001 |
| WO | WO 01/029893 | 4/2001 |
| WO | WO 01/053565 | 7/2001 |
| WO | WO 01/066832 | 9/2001 |
| WO | WO 01/078213 | 10/2001 |
| WO | WO 01/088972 | 11/2001 |
| WO | WO 2004/077515 | 9/2004 |
| WO | WO 2006/080782 | 8/2006 |
| WO | WO 2007/041089 | 4/2007 |
| WO | WO 2008/051851 | 5/2008 |
| WO | WO 2008/137399 | 11/2008 |

OTHER PUBLICATIONS

Titanium Nitride Properties, http://www.enigmatic-consulting.com/semiconductor_processing/CVD_Fundamentals/films/TiN.html, accessed online Oct. 30, 2015.*
Definition of dielectric material (http://whatis.techtarget.com/definition/dielectric-material?vgentfmt=print, accessed online Aug. 23, 2017).*
Pilvi ("Atomic Layer Deposition for optical applications: metal fluoride thin films and novel devices", Tero Pilvi), Helsinki 2008.*
"Resistance and Resistivity", http://hyperphysics.phy-astr.gsu.edu/hbase/electric/resis.html accessed online Apr. 5, 2018.*
Li et al ("Multifunctional metal matrix composites with embedded printed electrical materials fabricated by ultrasonic additive manufacturing", Li et al, Composites Part B: Engineering, vol. 113, Mar. 15, 2017, pp. 342-354) (Year: 2017).*
1988RD-0296076 (Nov. 20, 1998), Field effect transistor structure with improved transconductant—contg. spacer-less conducting gate oxide, and tungsten deposited on source and drain, East Version 2.0.1.4 Patent-Assignee: Anonymous[ANON], Sep. 19, 2005.
Aarik et al., "Influence of substrate temperature on atomic layer growth and properties of HfO2 thin films", Thin Solid Films, vol. 340, 1999, pp. 110-116.
Alen et al., "Atomic Layer Deposition of Ta(Al)N(C) Thin Films Using Trimethylaluminum as a Reducing Agent", Journal of the Electrochemical Society, vol. 148, No. 10, pp. G566-G571, 2001.
Andricacos et al., Damascene copper electroplating for chip, IBM Jour. Research and Dev., 1998, vol. 42, Issue 5, pp. 567-574.
Bain et al., Deposition of tungsten by plasma enhanced chemical vapour deposition, J. Phys. IV France, 1999, vol. 9, pp. 827-833.
Chang et al, "Chemical Vapor Deposition of Tantalum Carbide and Carbonitride Thin Films from Me3CE=Ta(CH2CMe3)3 (E=CH, N)," J. Mater. Chem. 13:365-369 (2003).
Chookarjorn et al, "Design of Stable Nanocrystalline Alloys," Science Magazine, vol. 337, pp. 951-954, Aug. 24, 2012.
Elers et al., NbCl5 as a precursor in atomic layer epitaxy, Applied Surface Science, Jul. 9, 1994, vol. 82/83, pp. 468-474.
Favis et al., Atomic layer epitaxy of silicon, silicon/germanium and silicon carbide via extraction/exchange processes, Avail. NTIS. Report, 1991, pp. 33.
Fuyuki et al., Atomic layer epitaxy controlled by surface superstructures in silicon carbide, Thin Solid Films, 1993, vol. 225, Issue 1-2, pp. 225-229.
Fuyuki et al., Atomic layer epitaxy of cubic silicon carbide by gas source MBE using surface superstructure, J. Cryst. Growth, 1989, vol. 95, Issue 1-4, pp. 461-463.
Girolami et al., Tailored Organometallics as Low-Temperature CVD Precursors to Thin Films, Materials Research Society Symposium Proceedings, 1988, vol. 121, pp. 429-438.
Gordon et al., "A Kinetic Model for Step Coverage by Atomic Layer Deposition in Narrow Holes or Trenches", Chemical Vapor Deposition, 2003, vol. 9, No. 2, pp. 73-78.
Hara et al., Atomic layer control of .beta.-silicon carbide (001) surface, Springer Proc. Phys., 1992, pp. 90-95.
Hiltunen et al., Nitrides of titanium, niobium, tantalum and molybdenum grown as thin films by the atomic layer epitaxy method, Thin Solid Films, 1988, vol. 166, pp. 149-154.
Hultman et al., "Review of the Thermal and Mechanical Stability of TiN-based Thin Films" Zeitscrift Fur Metallkunde 90 (10): 803-813 (1999).
Ihanus et al., "ALE growth of $ZnS_{1-x}Se_x$ thin films by substituting surface sulfur with elemental selenium," Appl. Surface Sci., 112:154-158 (1997).
International Search Report and Written Opinion dated Apr. 7, 2008, Application No. PCT/US2007/082131.
Jehn et al., Gmelin Handbook of Inorganic and Organometallic Chemistry, 8th Edition, 1993, vol. A 5b, Issue 54, pp. 131-154.
Jeon et al., A Study on the Characteristics of TiN Thin Film Deposited by Atomic Layer Chemical Vapor Deposition Method, J. Vac .Sci. Technol. A, 2000, vol. 18, Issue 4, pp. 1595-1598.
Juppo et al., Deposition of copper films by an alternate supply of CuCl and Zn, J. Vac. Sci. Technol A, Jul./Aug. 1997, vol. 15, Issue 4, pp. 2330-2333.
Kattelus et al., "Electrical Properties of Tantalum Based Composite Oxide Films," Mat. Res. Soc. Symp. Proc. vol. 284, pp. 511-516 (1993).
Kattelus et al., "Layered tantalum-aluminum oxide films deposited by atomic layer epitaxy," Thin Solid Films, Vo. 225, pp. 296-298 (1993).

(56) References Cited

OTHER PUBLICATIONS

Kim et al., Atomic-layer-deposited WNxCy thin films as diffusion barrier for copper metallization, Applied Physics Letters, Jun. 23, 2003, vol. 82, Issue 25, pp. 4486-4488.
Kim et al., "Novel capacitor technology for high density stand-alone and embedded DRAMs," IEEE International Electron Devices Meeting, IEDM (2000).
Kirk-Othmer, Encyclopedia of Chemical Technology, John Wiley & Sons, Inc., 1992, vol. 4, pp. 841-878.
Klaus et al., Atomic Layer Deposition of Tungsten Nitride Films Using Sequential Surface Reactions, Journal of the Electrochemical Society, 2000, vol. 147, Issue 3, pp. 1175-1181.
Klaus et al., Atomic layer deposition of tungsten using sequential surface chemistry with a sacrificial stripping reaction, Thin Solid Films, 2000, vol. 360, pp. 145-153.
Klaus et al., Atomic layer deposition of tungsten and tungsten nitride using sequential surface reactions, AVS $46^{th}$ International Symposium, 1999, Seattle, WA, US.
Klaus et al., Atomically controlled growth of tungsten and tungsten nitride using sequential surface reactions, Applied Surface Science, 2000, vol. 162-163, pp. 479-491.
Kukli et al., Properties of $(Nb_{1-x}Ta_x)_2O_5$ Solid Solutions and $(Nb_{1-x}Ta_x)_2O_5$-$ZrO_2$ Nanolaminates Growth by Atomic Layer Epitaxy, , NanoStructured Materials, 1997, vol. 8, pp. 785-793.
Lai et al., Precursors for Organometallic Chemical Vapor Deposition of Tungsten Carbide Films, Chem. Mater., 1995, vol. 7, pp. 2284-2292.
Lakomaa et al., "Surface reactions in $Al_2O_3$ growth from trimethylaluminum and water by atomic layer epitaxy," Applied Surface Science, vol. 107, pp. 107-115 (1996).
Leskelä et al., ALD precursor chemistry: Evolution and future challenges, Jour. Phys. IV France 9, 1999, pp. 837-852.
Ludviksson et al., Low-Temperature Thermal CVD of Ti-Al Metal Films Using a Strong Reducing Agent, Chem. Vap. Deposition, 1998, vol. 4, Issue 4, pp. 129-132.
Martensson, Use of atomic layer epitaxy for fabrication of Si/TiN/Cu structures, J. Vac. Sci. Technol. B, Sep./Oct. 1999, vol. 17, Issue 5, pp. 2122-2128.
Martensson et al., Atomic Layer Epitaxy of Copper and Tantalum, Chemical Vapor Deposition, 1997, vol. 3, Issue 1, pp. 45-50.
Martensson et al., $CU(THD)_2$ As Copper Source in Atomic Layer Epitaxy, Electrochemical Society Proceedings, vol. 97-25, (1997) pp. 1529-1536.
Matsunami et al., Hetero-interface control and atomic layer epitaxy of SiC, Applied Surface Science, 1997, vol. 112, pp. 171-175.
Min et al., Atomic Layer Deposition of TiN Films by Alternate Supply of Tetrakis (ethylmethylamino)-Titanium and Ammonia, Jpn. J. Appl. Phys., 1998, vol. 37, pp. 4999-5004.
Min et al., Atomic Layer Deposition of TiN Thin Films by Sequential Introduction of Ti Precursor and $HN_3$, Mat. Res. Soc. Symp. Proc., 1998, vol. 514, pp. 337-342.
Nakajima et al., Chemical Vapor Deposition of Tungsten Carbide, Molybdenum Carbide Nitride, and Molybdenum Nitride Films, J. Electrochem. Soc., Jun. 1997, vol. 144, Issue 6, pp. 2096-2100.
Polyakov et al., Growth of GaBN Ternary Solutions by Organometallic Vapor Phase Epitaxy, Journal of Electronic Materials, 1997, vol. 26, Issue 3, pp. 237-242.
Ritala et al., Atomic layer epitaxy growth of TiN thin films, J. Electrochem. Soc., 1995, vol. 142, Issue 8, pp. 2731-2737.
Ritala et al., Atomic Layer Epitaxy Growth of TiN Thin Films from $TiI_4$ and $NH_3$, J. Electrochem. Soc., Aug. 1998, vol. 145, Issue 8, pp. 2914-2920.
Ritala et al., "Controlled Growth of TaN, Ta3N5, and TaOxNy Thin Films by Atomic Layer Deposition", Chem. Mater., 1999, vol. 11, pp. 1712-1718.
Ritala et al., Effects of intermediate zinc pulses on properties of TiN and NbN films deposited by atomic layer epitaxy, Appl. Surf. Sci., 1997, vol. 120, pp. 199-212.
Ritala et al., Perfectly conformal TiN and Al2O3 films deposited by atomic layer deposition, Chem. Vapor Deposition, 1999, vol. 5, pp. 7-9.
Ritala et al., Surface roughness reduction in atomic layer epitaxy grown of titanium dioxide thin films, Thin Solid Films, vol. 249, pp. 155-162 (1994).
Sadayuki et al., Sub-atomic layer growth of SiC at low temperatures, Japanese Journal of Applied Physics, 1995, vol. 34, Issue 11, pp. 6166-6170.
Sherman et al., Plasma enhanced atomic layer deposition of Ta for diffusion barrier applications, AVS $46^{th}$ International Symposium, Oct. 26, 1999, Seattle, WA, US.
Song et al., "Formation of Tantalum Carbide and Nitride Phases in Atomic Layer Deposition Using Hydrogen Plasm and tert-Butylimidotris(diethylamido)-tantalum (TBTDET), and its Effect on Material Properties", Chemical Vapor Deposition, 2008, vol. 14, pp. 334-338.
Suntola, "Atomic Layer Epitaxy," Handbook of Crystal Growth 3, Ch. 14, pp. 601-663 (1994).
Tulhoff et al., Ullmann's Encyclopedia of Industrial Chemistry, $5^{th}$, Completely Revised Edition, 1986, vol. A5, pp. 61-77.
U.S. Appl. No. 10/049,125, filed Aug. 20, 2002 including prosecution history, including but not limited to, Office Action dated Apr. 8, 2004, Office Action dated Jun. 18, 2003, and Office Action dated Oct. 27, 2003.
U.S. Appl. No. 10/242,368, filed Sep. 12, 2002 including prosecution history, including but not limited to, Office Action dated Oct. 20, 2004, Office Action dated Apr. 27, 2004, and Notice of Allowance dated Jul. 19, 2005.
U.S. Appl. No. 10/969,297, filed Oct. 19, 2004 including prosecution history, including but not limited to, Office Action dated Oct. 11, 2006, Office Action dated Apr. 12, 2007, and Notice of Allowance dated Sep. 18, 2007.
U.S. Appl. No. 11/286,203, filed Nov. 22, 2005 including prosecution history, including but not limited to Office Action dated Sep. 28, 2007.
U.S. Appl. No. 11/288,872, filed Nov. 28, 2005 including prosecution history, including but not limited to, Office Action dated Jul. 2, 2007, Office Action dated Jan. 30, 2008, Office Action dated Sep. 9, 2008, Office Action dated Dec. 4, 2008, and Office Action dated Aug. 20, 2009.
U.S. Appl. No. 11/591,845, filed Nov. 1, 2006 including prosecution history, including but not limited to, Office Action dated Sep. 4, 2008, Office Action dated May 28, 2009, and Notice of Allowance dated Sep. 4, 2009.
Utriainen et al., "Controlled Electrical Conductivity in SnO2 Thin Films by Oxygen or Hydrocarbon Assisted Atomic Layer Epitaxy," J. Electrochem. Soc. 146(1):189-193 (1999).
Wong et al., Barriers for copper interconnections, Solid State Technology, 1999, pp. 1-7.
Yang et al., Atomic Layer Deposition of Tungsten Film from WF6/B2H6: Nucleation Layer for Advanced Semiconductor Devices, Advanced Metallization Conference 2001 (AMC 2001), Conference Proceedings ULSI XVII@2002 Materials Research Society, 2001, pp. 655-660.
Zhang et al., "High permittivity thin film nanolaminates," Journal of Applied Physics, vol. 87, No. 4, pp. 1921-1924 (2000).
International Search Report and Written Opinion dated Jun. 25, 2015 in Application No. PCT/US2015/023492.
International Search Report and Written Opinion for International Application No. PCT/US2016/055496, Notification dated Dec. 23, 2016.
Perebeinos et al., Investigation of the Jahn-Teller Transition in $TiF_3$ using Density Functional Theory, Department of Physics, Brookhaven National Laboratory, pp. 1-7, Jul. 26, 2013.
Pilvi, Atomic Layer Deposition for optical applications: metal fluoride thin films and novel devices, Academic Dissertation, University of Helsinki, 2008.
Triyoso, D.H. et al., "Characteristics of Mixed Oxides and Nanolaminates of Atomic Layer Deposited $HfO_2$-$TiO_2$ Gate Dielec-

(56) References Cited

OTHER PUBLICATIONS trics," Journal of The Electrochemical Society, 153 (9), pp. 834-839, 2006.

* cited by examiner

US 10,643,925 B2

FLUORINE-CONTAINING CONDUCTIVE FILMS

BACKGROUND OF THE INVENTION

Field of the Invention

The application relates generally to the field of semiconductor device manufacturing and more particularly to methods for forming fluoride-containing conductive thin films.

Description of the Related Art

Atomic layer deposition (ALD) is based on sequential, self-saturating surface reactions, which can provide good conformality and step coverage regardless of the geometry of the structure to be coated. However, deposition of metallic films by ALD has been challenging, in part because ALD is based essentially on thermodynamically favorable half-reactions.

Refractory metal conducting layers are basic building blocks in micro and nano-electronics. Oxidation resistant metal thin films are desirable in a number of contexts. For example, titanium nitride layers are commonly used in the semiconductor manufacturing industry, for example, as a gate electrode material or as a copper diffusion barrier. However, titanium nitride is known to oxidize from the surface when stored in air, likely through grain boundaries, up to depths of tens of nanometers.

SUMMARY OF THE INVENTION

In one aspect, atomic layer deposition (ALD) processes are provided for depositing conductive fluorine-containing thin films. In some embodiments the ALD processes may comprise a plurality of super-cycles, where at least one super-cycle comprises two sub-cycles: a metal fluoride sub-cycle and a second sub-cycle. In some embodiments, the metal fluoride sub-cycle comprises contacting the substrate with a metal fluoride, and the second sub-cycle comprises alternately and sequentially contacting the substrate with a silane or borane and a nitrogen reactant. In some embodiments the second sub-cycle is referred to as a reducing sub-cycle and the substrate is contacted with a reducing agent and a nitrogen reactant.

According to some embodiments, the metal fluoride comprises a metal selected from Ti, Ta, Nb, Mo and W. In some embodiments, the metal fluoride comprises $TiF_4$. In some embodiments, the reducing agent is a silane or borane. In some embodiments, the reducing agent comprises disilane or trisilane. In some embodiments, the reducing agent comprises diborane or triborane. In some embodiments, the nitrogen reactant is selected from the group consisting of ammonia, $N_2H_4$, nitrogen atoms, nitrogen containing plasma and nitrogen radicals. In some embodiments, the metal fluoride is $TiF_4$ and the reducing agent is $Si_3H_8$. In some embodiments, the metal fluoride sub-cycle and the reducing sub-cycle are carried out at a ratio of at least about 0.1 in at least one of the plurality of super-cycles. In some embodiments, the fluorine containing thing film comprises $TiF_3$.

According to some embodiments of a process for forming a fluorine-containing thin film, the fluorine containing thin film comprises about 0.4 to about 2.3 at % silicon. In some embodiments, the fluorine containing thin film comprises about 5 to about 40 at % nitrogen. In some embodiments, the fluorine containing thin film is conductive. In some embodiments, the fluorine-containing thin film has a layer resistivity of less than about $10^6$ μΩcm. In some embodiments, the fluorine containing thin film is not oxidized by an air ambient at less than about 300° C.

According to some embodiments, there is disclosed herein a conductive, fluoride thin film comprising $TiF_3$. In some embodiments, the thin film comprises about 5 to about 40 at % nitrogen. In some embodiments, the thin film comprises about 0.4 to about 2.3 at % silicon. In some embodiments, the thin film has a thickness of less than about 100 nm. In some embodiments, the thin film has a thickness of less than about 10 nm.

According to some embodiments, there is disclosed herein an ALD process for depositing a fluorine-containing thin film on a substrate, the process comprising a plurality of super-cycles, each super-cycle comprising a metal fluoride sub-cycle and a second sub-cycle. In some embodiments, the metal fluoride sub-cycle comprises contacting the substrate with a metal fluoride. In some embodiments, the second sub-cycle comprises contacting the substrate with a nitrogen reactant. In some embodiments, at least one of a silane compound and a borane compound is separately provided in at least one of the metal fluoride sub-cycle and the second sub-cycle.

In some embodiments of an ALD process, at least one of a silane compound and a borane compound is provided in the metal fluoride sub-cycle. In some embodiments, at least one of a silane compound and a borane compound is provided in the second sub-cycle. In some embodiments, the fluorine-containing thin film achieved by the process has a thickness of less than about 100 nm. In some embodiments, at least one of the silane compound, borane compound, and nitrogen reactant reduces at least some of the metal of the metal fluoride. In some embodiments, the fluorine-containing thin film achieved by the process comprises $TiF_3$. In some embodiments, the fluorine-containing thin film achieved by the process exhibits a layer resistivity of less than about $10^6$ μΩcm. In some embodiments, the fluorine-containing thin film achieved by the process exhibits substantially no oxidation at temperatures below about 300° C.

BRIEF DESCRIPTION OF THE DRAWINGS

The invention will be better understood from the detailed description and from the appended drawings, which are meant to illustrate and not to limit the invention, and wherein.

DETAILED DESCRIPTION

Figure 1:
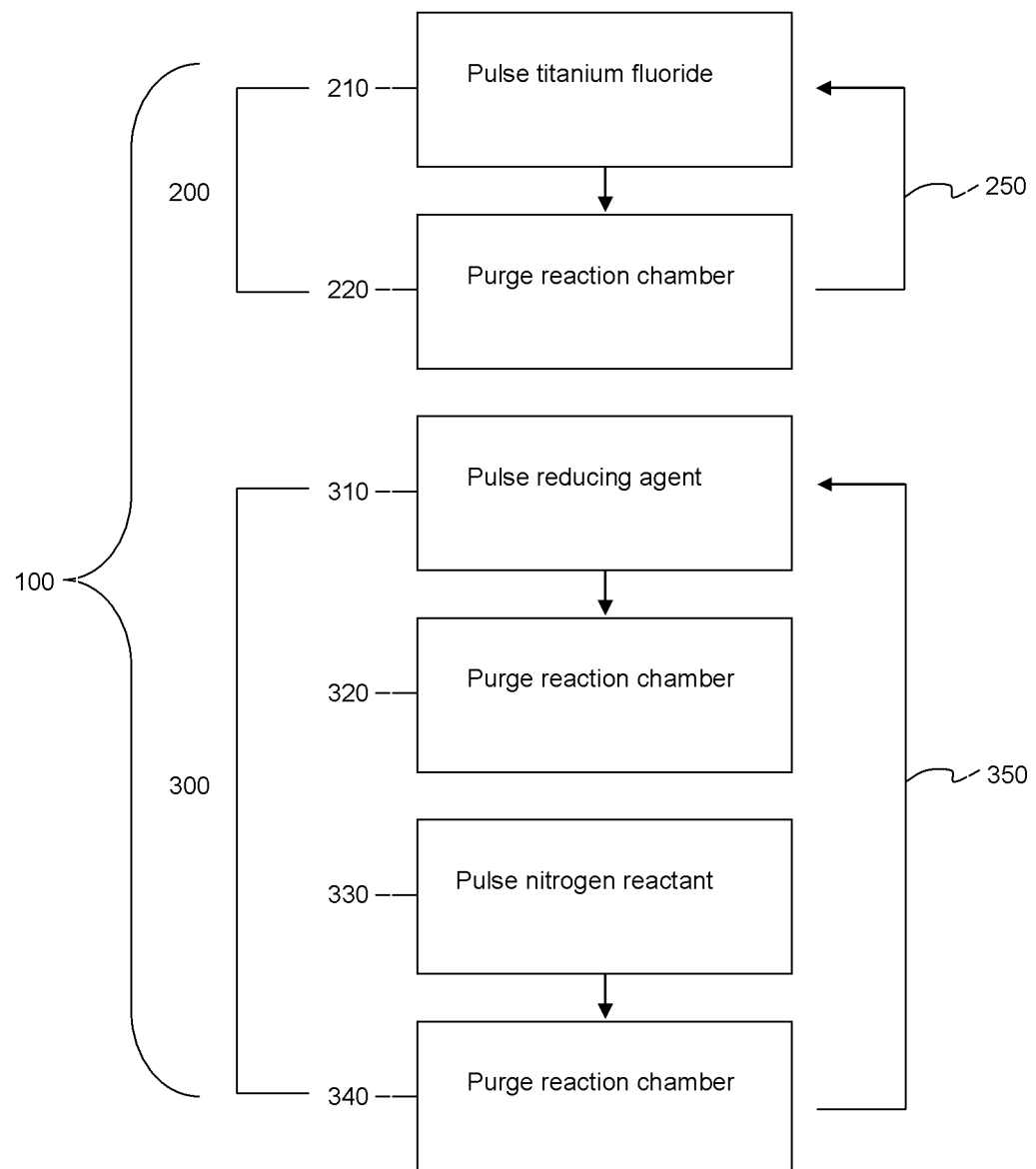
FIG. 1 is a flow chart illustrating an ALD process for depositing a $TiF_3$/TiN film according to one embodiment.

As discussed herein, fluorine-containing conductive thin films can be deposited by vapor deposition processes, for example by atomic layer deposition (ALD). Such films can desirably be oxidation resistant. Titanium fluoride ($TiF_3$) is a stable, solid fluoride that can be used in a variety of contexts, for example as a catalyst; however, deposition of titanium fluoride films by vapor deposition processes has not previously been achieved.

The presence of fluorine in some metal thin films enhances oxidation resistance. Metal nitrides, such as titanium nitride, are commonly used in the semiconductor industry, for example as barrier films. However, as discussed above titanium nitride films can be subject to undesirable oxidation. The present application is based, in part, on the unexpected finding that a conductive thin film comprising a metal fluoride, such as a conductive thin film comprising titanium fluoride, can be deposited by ALD. In some embodiments the titanium fluoride-containing film has greater oxidation resistance than a TiN film, such as a TiN film deposited by known vapor deposition processes, for example by ALD.

The conductive fluorine-containing films may be used in a variety of contexts. For example, a conductive fluoride film, or a conductive film comprising metal fluoride, such as a conductive thin film comprising $TiF_3$, may be used as an oxygen barrier film over a TiN layer or other metallic film. In some embodiments conductive fluorine-containing films formed according to the present disclosure would be useful as a barrier film against ashing or other oxidative conditions. In some embodiments, conductive fluorine-containing films formed according to the present disclosure may be used as a protective layer against ambient environments comprising oxygen, such as ambient air and/or water or moisture. In some embodiments, the conductive, fluorine-containing films of the present disclosure are useful as sacrificial layers, such as in patterning layers or in other applications where good oxidation resistance is desired. In some embodiments, a conductive fluoride thin film is deposited conformally over vertical and horizontal surfaces. In some embodiments, a conductive film comprising metal fluoride can be used as a p-type capping layer on a gate stack, for example on top of high-k layer, such as $HfO_2$, and below an actual gate electrode layer or a conductive gate dielectric barrier layer. In some embodiments, when a conductive film comprising metal fluoride is used as a p-type capping layer, the effective work function of the electrode in the stack is above about 4.9 eV, preferably between about 5.0 and about 5.2 eV.

In some embodiments, the conductive fluorine-containing film does not comprise one or more of the following materials: $MgF_2$, $CaF_2$, $ZnF_2$, $SrF_2$, $YF_3$, or $LaF_3$. In some embodiments, the conductive fluorine-containing film does not comprise one or more of the following materials: $AlF_3$ or LiF. In some embodiments, the conductive fluorine-containing film does not comprise one or more of the following materials: alkali metal fluorides (group 1 in periodic table of elements), such as KF or alkaline earth (group 2 in periodic table of elements) metal fluorides, such as $MgF_2$ or $CaF_2$. In some embodiments, the conductive fluorine-containing film does not comprise one or more of the following materials: group 3 metal fluorides, such as $YF_3$ or $LaF_3$. In some embodiments, the conductive fluoride film does not comprise more than about 20 at %, preferably more than about 10 at %, more preferably more than about 5 at %, and most preferably more than about 1 at % of one or more of the following metals: alkali metals, alkaline earth metals, and group 3 metals. In some embodiments, the conductive fluorine-containing film does not comprise more than about 20 at %, preferably more than about 10 at %, more preferably more than about 5 at %, and most preferably more than about 1 at % of one or more of the following metals: Mg, Ca, Zn, Sr, Y, or La. In some embodiments, the conductive fluorine-containing film does not comprise more than about 20 at %, preferably more than about 10 at %, more preferably more than about 5 at %, and most preferably more than about 1 at % of metals other than one or more of the following metals: Ti, Zr, Hf, V, Nb, Ta, Cr, Mo, or W, and preferably metals other than one or more of the following metals: Ti, Nb, Ta, Mo, and W.

In some embodiments, ALD processes are provided for depositing a conductive film comprising metal fluoride on a substrate. In some embodiments, the processes may comprise a first sub-cycle in which the substrate is exposed to a vapor phase metal fluoride, such as $TiF_4$, and a monolayer of metal fluoride is adsorbed on the substrate surface. In a second sub-cycle, a vapor phase silane or borane compound, or other "reducing agent", and a vapor phase nitrogen reactant are alternately and sequentially provided. The reducing agent and nitrogen reactant react with the metal fluoride on the substrate surface to form a conductive film comprising metal fluoride. In some embodiments, a first sub-cycle may include both a vapor phase metal fluoride, such as $TiF_4$, and a reducing agent, such as a silane or a borane. In some embodiments, a second cycle does not include a silane or a borane. Thus, in some embodiments, a first cycle comprises a vapor phase metal fluoride and a silane or a borane, and a second cycle comprises a vapor phase nitrogen reactant. Although the term "reducing agent" is used, in some embodiments, chemical reduction is not required. Thus, in some embodiments the term "reducing agent" simply represents a silane compound or a borane compound. However, without being bound to any theory, it is believed that in some embodiments, a reducing agent as herein described might reduce the oxidative state of a metal species on the surface.

In some embodiments the metal may be selected from Ti, Ta, Nb, Mo, and W, for example. The reducing agent may be, for example, a silane or borane compound. The nitrogen reactant may be, for example, $NH_3$. In some embodiments where a nitrogen reactant is used, the nitrogen reactant may exhibit at least some reducing effect on the oxidation state of a metal species on the substrate surface.

The first and second sub-cycles together make an ALD super-cycle. In each super-cycle, the first sub-cycle and the second sub-cycle may be independently repeated one or more times. Further, the super-cycle may be repeated one or more times to deposit a conductive film comprising metal fluoride to a desired thickness. The first and second sub-cycles can be performed in any order. For example, in some embodiments the second sub-cycle may be performed first. Moreover, the order of the reactants in each sub-cycle may be varied. For example, in some embodiments, in the reducing sub-cycle—which may be performed first or second—the nitrogen reactant is pulsed before the silane or borane compound or vice versa.

The ratio of the first sub-cycle to the second sub-cycle within one or more super-cycles can be varied to deposit a film with a desired composition and/or desired properties. In some embodiments the ratio of the first sub-cycle to the second sub-cycle is the same in each super-cycle in the ALD process. In some embodiments the ratio of first sub-cycles to second sub-cycles may vary in one or more super-cycles during the deposition process.

In some embodiments a conductive thin film comprising metal fluoride is formed that comprises some silicon or boron from the reducing compound and/or some nitrogen from the nitrogen reactant. For example, in some embodiments a conductive thin film comprising $TiF_3$ is deposited that contains some Si and some N.

All atomic percentage (i.e., at %) values provided herein exclude hydrogen for simplicity and because hydrogen is difficult to accurately analyze quantitatively.

In some embodiments, a silane is used as a reducing agent and the conductive film comprising metal fluoride also comprises a small amount of silicon. For example, in some embodiments, the silicon content may be less than about 15 at %. In some embodiments the silicon content may be from about 0.01 to about 10 at %, from about 0.1 to about 5 at %, or from about 0.1 to about 2 at %. In some embodiments, the silicon content in a conductive film comprising metal fluoride is preferably less than about 1.5 at %.

In some embodiments a borane is used as a reducing agent and the conductive film comprising metal fluoride also comprises a small amount of boron. For example, in some embodiments, the boron content may be less than about 15 at %. In some embodiments the boron content is from about 0.01 to about 10 at %, from about 0.1 to about 5 at %, or from about 0.1 to about 2 at %. In some embodiments, the boron content is less than about 1.5 at %.

In some embodiments, the films comprise a small amount of nitrogen. For example, in some embodiments, the nitrogen content may range from about 0.5 to about 50 at %, from about 1 to about 20 at %, or from about 2 to about 15 at %.

In some embodiments, the films comprise fluorine in an amount greater than about 10 at %, from about 20 to about 75 at %, from about 40 to about 70 at %, or from about 45 to about 65 at %.

In some embodiments, the films have a fluorine to titanium ratio (F/Ti (at %/at %)) of from about 0.25 to about 5, from about 0.5 to about 3, or from about 1 to about 2.5.

In some embodiments, the films may comprise a small amount of oxygen, despite the fact that the films are oxidation resistant. For example, in some embodiments, the oxygen content is less than about 2.5 at %, less than about 1.5 at %, less than about 1.0 at %, or even less than about 0.5 at %.

In some embodiments a conductive film comprising metal fluoride and deposited by an ALD process as described herein has a greater oxidation resistance than a corresponding metal nitride film deposited by a known vapor deposition process, such as by ALD.

In some embodiments, the metal fluoride films have a good smoothness, which can reduce or prevent oxidation of an underlying film, for example a TiN film beneath a layer comprising $TiF_3$. In some embodiments, oxygen diffusion or oxidation of a film comprising metal fluoride does not proceed as deep as in an underlying film, such as an underlying TiN layer.

In some embodiments a conductive thin film comprising $TiF_3$ is deposited by an ALD process comprising a first sub-cycle for adsorbing $TiF_4$ on a substrate surface in a self-limiting manner and a second sub-cycle for reducing the $TiF_4$ to $TiF_3$. For example $TiF_4$ may be provided in a first sub-cycle such that up to a monolayer of $TiF_4$ forms on a substrate surface. The first sub-cycle may be repeated two or more times. In some embodiments, a purge step is included between respective first sub-cycles. In the second sub-cycle the substrate is alternately and sequentially exposed to a reducing agent, such as a silane or a borane compound, and a nitrogen reactant, such as ammonia. The second sub-cycle serves to reduce at least a portion of the $TiF_4$ on the substrate surface to $TiF_3$. In some embodiments, the films formed comprise $TiF_3$ with relatively small amounts of silicon or boron and nitrogen. In some embodiments, the films formed comprise a mixture of $TiF_3$ and some nitrogen. In some embodiments the film is a mixture of $TiF_3$ and TiN.

Each of the first and second sub-cycles may be repeated one or more times in a super-cycle. The super-cycle is repeated until a film of the desired thickness is achieved. By adjusting the ratio of the two sub-cycles in one or more super-cycles, the quantity of $TF_3$ can be increased without introducing an undesirable amount of silicon or nitrogen. In particular, in some embodiments increasing the number of second sub-cycles in which the substrate is alternately and sequentially contacted with the reducing agent and the nitrogen reactant, relative to the first sub-cycle, increases the amount of $TiF_4$ that is converted to $TiF_3$.

In some embodiments the reducing (second) sub-cycle may utilize a silicon compound; however, other compounds may be used. In some embodiments, the silicon compound is a silane compound, such as $SiH_4$, $Si_2H_6$, or $Si_3H_8$. In some embodiments, a boron compound may be used in at least one reducing sub-cycle. For example, in some embodiments, the reducing agent may be a borane compound, such as one or more of $BH_3$, $B_2H_6$, or triborane. It will be appreciated that other reducing agents may also be used. In some embodiments the same reducing agent is used in each sub-cycle, while in other embodiments different reducing agents may be utilized in one or more sub-cycles.

In some embodiments the nitrogen reactant may comprise one or more of $NH_3$, nitrogen atoms, nitrogen radicals, nitrogen plasma, other excited species comprising nitrogen that can, for example, be generated by a plasma, or other suitable nitrogen-containing compounds.

In some embodiments a conductive thin film comprising $TiF_3$ is deposited that has a greater oxidation resistance than a TiN film deposited by known vapor deposition processes that do not incorporate fluorine in the film, such as a TiN film deposited by ALD.

In some embodiments a conductive thin film comprising fluorine, such as a metal fluoride thin film comprising at least some nitrogen, is deposited that is smooth and does not have a columnar grain structure. In some embodiments, the film has grain structure or morphology that does not have many or too much substantial grain boundaries, for example compared to normal ALD TiN films, which also tends to suppress the oxidation of the film. In some embodiments the conductive thin film comprising fluorine has fewer grain boundaries than a TiN film deposited by ALD.

In some embodiments a conductive thin film comprising $TiF_3$\ with a thickness of about 500 nm or less is deposited. In some embodiments the thin film has a thickness of less than about 100 nm, less than about 50 nm, or less than about 10 nm. In some embodiments the thickness can be selected depending on the application where the film would be used. For example where the film is to serve as a p-type capping layer or as an oxidation prevention layer, the thickness of the film could be much less than described above, for example, from about 2 to about 50 Å, from about 3 to about 30 Å, and in some cases from about 5 to about 20 Å.

In some embodiments, the conductive, thin film comprising fluorine, such a metal fluoride thin film comprising at least some nitrogen, is not a nanolaminate and separate layers of metal fluoride and metal nitride are not visible. In some embodiments less than about 60 or less than about 40 consecutive metal fluoride deposition sub-cycles (MF) are carried out in a super-cycle. In some embodiments less than about 10 or less than about 5 consecutive reducing sub-cycles are carried out in a super-cycle.

For example, in some embodiments a conductive thin film comprising $TiF_3$ is not a nanolaminate film or a film in which distinct and separate layers of titanium fluoride and titanium nitride are observable.

While illustrated primarily in the context of forming conductive thin films comprising $TiF_3$, other metal fluoride films or films containing at least some fluorine can be deposited using an ALD super-cycle comprising at least one sub-cycle in which a metal fluoride reactant is utilized. For example in some embodiments a metal nitride film comprising two different metals and fluorine may be deposited by an ALD process comprising a first sub-cycle in which a substrate is alternately and sequentially contacted with a first metal reactant and a first nitrogen reactant and a second sub-cycle in which the substrate is alternately and sequentially contacted with a metal fluoride and a reducing agent, such as a silane or borane. Exemplary processes are described, for example, in U.S. application Ser. No. 13/802,157, which is incorporated by reference herein in its entirety.

In some embodiments methods a provided for depositing an $M^1_xM^2_yN_z$ film, where $M^1$ and $M^2$ are different metals, and may be selected, for example, from Ti, Ta, Nb, Mo, and W. In some embodiments the methods comprise a first ALD sub-cycle in which a first metal nitride is deposited by alternately and sequentially contacting a substrate with a metal precursor, such as a metal halide, and a nitrogen reactant, such as $NH_3$, and a second ALD sub-cycle in which elemental metal is deposited by alternately and sequentially contacting the substrate with a second, different metal fluoride reactant and a second reactant, such as $Si_2H_6$. The two sub-cycles together form a super-cycle that can be repeated as many times as desired to achieve a film of an appropriate thickness for a particular application. Within each super-cycle, the ratio of metal nitride to metal sub-cycles can be adjusted to achieve a desired film composition and properties. In some embodiments, the surface of the $M^1_xM^2_yN_z$ film comprises about 0.5 at % to about 10 at % fluorine. In some embodiments, the entire $M^1_xM^2_yN_z$ film comprises about 0.1 at % to about 5 at %, preferably from about 0.3 at % to about 4 at % fluorine.

In some embodiments, methods of forming a $Ti_xW_yN_z$ film comprise a first ALD sub-cycle in which titanium nitride is deposited by alternately and sequentially contacting a substrate with a titanium precursor, such as $TiCl_4$ and a nitrogen reactant, such as $NH_3$, and a second ALD sub-cycle in which tungsten is deposited by alternately and sequentially contacting the substrate with a tungsten fluoride reactant, such as $WF_6$ and a second reducing reactant, such as $Si_2H_6$. The nitrogen and reducing reactants can be as described elsewhere herein. The two sub-cycles together form a super-cycle that can be repeated as many times as desired to achieve a thin film comprising fluorine, of an appropriate thickness for a particular application. Within each super-cycle, the ratio of TiN to W sub-cycles can be adjusted to achieve a desired film composition and properties.

The ALD processes described herein can be used to deposit films comprising metal fluoride, which can be referred to as MF films, such as films comprising titanium fluoride. The stoichiometry, and thus the relative amounts of M and F can vary. For example, the relative amounts of Ti and F in a film comprising titanium fluoride can vary. Further, as discussed above, in some embodiments the films can comprise two different metals. The amount of each element in the film can be controlled, for example by controlling the ratio of the sub-cycles in the deposition processes.

For example, in some embodiments for forming conductive films comprising $TiF_3$, increasing the number of reducing sub-cycles relative to the titanium fluoride sub-cycles may reduce the amount of $TiF_4$ in the film while increasing the amount of $TiF_3$ in the film. In some embodiments, the titanium fluoride to reducing sub-cycle ratio is less than or equal to about 1 and $TiF_3$ films with a nitrogen content of less than about 10 at.-% can be produced. As the titanium fluoride to reducing sub-cycle ratio increases, the amount of fluoride generally in the film increases and the relative $TiF_3$ content increases and the nitrogen content may also decrease. Without being bound to any theory, it is believed that in some circumstances a solid solution may be formed. In some embodiments this may lead to a phenomenon called solid solution strengthening.

Atomic Layer Deposition (ALD)

ALD type processes are based on controlled, self-limiting surface reactions of precursor chemicals. Gas phase reactions are avoided by feeding the precursors alternately and sequentially into the reaction chamber. Vapor phase reactants are separated from each other in the reaction chamber, for example, by removing excess reactants and/or reactant by-products from the reaction chamber between reactant pulses.

Briefly, a substrate is loaded into a reaction chamber and is heated to a suitable deposition temperature, generally at lowered pressure. In some embodiments the substrate comprises a 300 mm silicon wafer. In some embodiments the substrate comprises a 450 mm wafer. Deposition temperatures are maintained below the precursor thermal decomposition temperature but at a high enough level to avoid condensation of reactants and to provide the activation energy for the desired surface reactions. Of course, the appropriate temperature window for any given ALD reaction will depend upon the surface termination and reactant species involved.

A first reactant is conducted or pulsed into the chamber in the form of vapor phase pulse and contacted with the surface of a substrate. Conditions are preferably selected such that no more than about one monolayer of the precursor is adsorbed on the substrate surface in a self-limiting manner. Excess first reactant and reaction byproducts, if any, are purged from the reaction chamber, often with a pulse of inert gas such as nitrogen or argon.

Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times are from about 0.05 to 20 seconds, more preferably between about 1 and 10, and still more preferably between about 1 and 2 seconds. However, other purge times can be utilized if necessary, such as when depositing layers over extremely high aspect ratio structures or other structures with complex surface morphology is needed. The appropriate pulsing times can be readily determined by the skilled artisan based on the particular circumstances.

A second gaseous reactant is pulsed into the chamber where it reacts with the first reactant bound to the surface. Excess second reactant and gaseous by-products of the surface reaction are purged out of the reaction chamber, preferably with the aid of an inert gas. The steps of pulsing and purging are repeated until a thin film of the desired thickness has been formed on the substrate, with each cycle leaving no more than a molecular monolayer. In forming metal fluoride films, such as $TiF_3$ films, two sub-cycles are repeated one or more times in each ALD super-cycle.

Additional reactants can also be supplied that aid in the deposition process. Such reactants can be provided either in their own pulses or along with precursor pulses, and can be used for example to provide a desired surface termination, or to strip or getter adhered ligands and/or free by-product. In some embodiments the additional reactants do not contribute any species to the growing film.

The precursors employed in the processes may be solid, liquid, or gaseous material under standard conditions (room temperature and atmospheric pressure), provided that they are in vapor phase before they are conducted into the reaction chamber and contacted with the substrate surface.

As mentioned above, each pulse or phase of each cycle or sub-cycle is preferably self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus provides excellent step coverage. In some arrangements, the degree of self-limiting behavior can be adjusted by, e.g., allowing some overlap of reactant pulses to trade off deposition speed (by allowing some CVD-type reactions) against conformality. Ideal ALD conditions with reactants well separated in time and space provide near perfect self-limiting behavior and thus maximum conformality, but steric hindrance results in less than one molecular layer per cycle. Limited CVD reactions mixed with the self-limiting ALD reactions can raise the deposition speed.

"Pulsing" a vaporized reactant onto the substrate means that the vapor is conducted into the chamber for a limited period of time. Typically, the pulsing time is from about 0.05 seconds to about 10 seconds. However, depending on the substrate type and its surface area, the pulsing time may be even higher than about 10 seconds.

As an example, for a 300 mm wafer in a single wafer ALD reactor, the precursors are typically pulsed for from about 0.05 seconds to about 10 seconds, more preferably for from about 0.1 seconds to about 5 seconds and most preferably for from about 0.3 seconds to about 3.0 seconds. However, pulsing times can be on the order of minutes in some cases. The optimum pulsing time can be readily determined by the skilled artisan based on the particular circumstances.

The mass flow rate of the metal precursor can be determined by the skilled artisan. In some embodiments, for example for deposition on 300 mm wafers, the flow rate of the reactants is preferably between about 1 sccm and about 1000 sccm, about 10 sccm to about 800 sccm, or about 50 sccm to about 500 sccm, without limitation.

The pulsing time and mass flow rate of each of the reactants can be selected independently. In some embodiments the pulsing time (and/or mass flow rates) of two or more of the reactants is the same, while in some embodiments the pulsing times (or mass flow rates) are different.

The pressure in the reaction chamber is typically from about 0.01 mbar to about 20 mbar, more preferably from about 1 mbar to about 10 mbar. However, in some cases the pressure will be higher or lower than this range, as can be readily determined by the skilled artisan depending on multiple parameters, such as the particular reactor being used, the process and the precursors.

Before starting the deposition of the film, the substrate may be heated to a suitable growth temperature, as discussed above. The preferred deposition temperature may vary depending on a number of factors such as, and without limitation, the reactant precursors, the pressure, flow rate, the arrangement of the reactor, and the composition of the substrate including the nature of the material to be deposited on. The specific growth temperature may be selected by the skilled artisan based on the particular circumstances.

In some embodiments, the deposition temperature is about 100° C. to about 700° C., about 200° C. to about 500° C., about 250° C. to about 400° C., or about 325° C. to about 375° C.

The processing time depends, in part, on the thickness of the layer to be produced, the composition of the film, the growth rate of the individual deposition sub-cycles and the overall growth rate.

Examples of suitable reactors that may be used include commercially available ALD equipment such as the F-120® reactor, Pulsar® reactor and Advance® 400 Series reactor, available from ASM America, Inc of Phoenix, Ariz. and ASM Europe B.V., Almere, Netherlands. In addition to these ALD reactors, many other kinds of reactors capable of ALD growth of thin films, including CVD reactors equipped with appropriate equipment and means for pulsing the precursors can be employed. In some embodiments a flow type ALD reactor is used.

In some embodiments the reactor is a batch reactor capable of holding more than about 50 substrates, more than about 100 substrates, or more than about 125 substrates. In some embodiments the reactor is a mini-batch reactor and has from 2 to about 20 substrates, from 3 to about 15 substrates, or from 4 to about 10 substrates. In some embodiments, the substrate is a silicon wafer, such as a silicon wafer having a diameter of at least about 150 mm. In some embodiments the substrate is a silicon wafer having a diameter of at least about 200 mm, or at least about 300 mm. In some embodiments, the substrate could be a silicon wafer having a diameter of at least about 450 mm.

The ALD processes for depositing conductive films comprising metal fluoride described herein can optionally be carried out in a reactor or reaction space connected to a cluster tool. In a cluster tool, because each reaction space is dedicated to one type of process, the temperature of the reaction space in each module can be kept constant, which improves the throughput compared to a reactor in which the substrate is heated up to the process temperature before each run.

A stand-alone reactor can be equipped with a load-lock. In that case, it is not necessary to cool down the reaction space between each run.

Deposition of Conductive Films Comprising Metal Fluoride

As mentioned above and discussed in detail below conductive, conductive films comprising metal fluoride can be deposited using a metal fluoride deposition sub-cycle and a reducing sub-cycle. In some embodiments the metal can be selected from Ti, Ta, Nb, Mo, and W. The two sub-cycles can be repeated at a desired ratio in a super-cycle to form a smooth and/or nanocrystalline film. In some embodiments the conductive thin films, such as thin films comprising metal fluoride, do not have a columnar grain structure.

In some embodiments the deposition process is an ALD process. In some embodiments, the deposition process is a sequential or cyclic process, such as a sequential or pulsed CVD process utilizing the same precursor and conditions selections as an ALD process. In some embodiments the deposition process is a PECVD process. In some embodiments the deposition process is an LPCVD/RTCDV process. In some embodiments the deposition process has a step which is not self-limiting. In some embodiments the process may operate in a process condition regime close to CVD conditions or in some cases fully in CVD conditions.

In some embodiment a conductive thin film comprising metal fluoride is deposited by a process that may comprise multiple super-cycles, where each super-cycle comprises at least one MF (metal fluoride) sub-cycle and at least one reducing sub-cycle. The ratio of the MF and reducing sub-cycles in each super-cycle can be varied to achieve the desired composition, and the number of super-cycles can be selected to deposit a fluorine-containing film of the desired thickness. In some embodiments, the number of each sub-cycle conducted consecutively in a super-cycle is limited such that a homogenous conductive thin film, such as a conductive film comprising metal fluoride, is formed, where distinct layers of MF and MN are not visible, for example, in a cross-section TEM or SEM image.

The super-cycle can be written as:

a[b(MF)+c(reducing agent+nitrogen compound)], where MF represents a $M_xF_y$ sub-cycle and b is the number of MF sub-cycles in each super-cycle; (reducing agent+nitrogen compound) represents the reducing sub-cycles and c is the number of reducing sub-cycles in each super-cycle; and a is the number of super-cycles. The ratio of metal fluoride to reducing sub-cycles can be given as b:c.

The first and second deposition sub-cycles (b and c) may be provided at a selected ratio to deposit a thin film with a desired composition and desired properties. For example, in some embodiments, the ratio of the first, metal fluoride deposition sub-cycle to the second reducing sub-cycle (b:c) in one or more super-cycles may be from about 0.01 to about 100, about 0.05 to about 50 or about 0.1 to about 1. In some embodiments, the ratio of metal fluoride adsorption sub-cycles to reducing sub-cycles in one or more super-cycles is less than one. In some embodiments, the ratio of metal fluoride adsorption sub-cycles to reducing sub-cycles in one or more super-cycles is between about 1 and about 3. In some embodiments, the ratio of metal fluoride adsorption sub-cycles to reducing sub-cycles in one or more super-cycles is between about 1 and about 50, between about 3 and about 30 or between about 5 and about 20. In some embodiments, the ratio of metal fluoride adsorption sub-cycles to reducing sub-cycles in one or more super-cycles is about 0.5, about 1, about 3, about 5, about 10, about 20, about 40 or about 50.

In some embodiments, the ratio of first metal fluoride adsorption sub-cycles to second reducing sub-cycles (b:c) is the same in all of the complete super-cycles performed in the process. In other embodiments, the specific ratio of first metal fluoride adsorption sub-cycles to second reducing sub-cycles can be varied in different complete super-cycles. The specific ratios can be selected by the skilled artisan to provide the desired amounts of metal, fluoride, and nitrogen in the film and thus to achieve a film with desired properties.

Although referred to as the first metal fluoride adsorption sub-cycle and the second reducing sub-cycle, in some embodiments one or more super-cycles begins with the reducing sub-cycle, which is followed (after repeating a desired number of times) by the metal fluoride adsorption sub-cycle (which may also be repeated a desired number of times before beginning another super-cycle).

In some embodiments, the super-cycle can be written as:

a[b(MF+reducing agent)+c(nitrogen reactant)], where b is the number of MF sub-cycles—which includes a reducing agent—in each super-cycle; c is the number of nitrogen reactant sub-cycles in each super-cycle; and a is the number of super-cycles. The ratio of metal fluoride to nitrogen sub-cycles can be given as b:c.

In some embodiments, the metal, or M, comprises Ti, Ta, Nb, Mo, or W.

In some embodiments, the reducing agent comprises a silane or a borane. In some embodiments, the reducing agent is silane, disilane, or trisilane. In some embodiments, the reducing agent is borane, diborane, or triborane. As mentioned above, although referred to as a "reducing agent," in some embodiments it is not necessary that actual chemical reduction takes place. Similarly, in some embodiments reduction does not necessarily take place in a "reducing sub-cycle."

In some embodiments the nitrogen-precursor can be selected from the group consisting of ammonia, $N_2H_4$, nitrogen atoms, nitrogen-containing plasma or nitrogen radicals or other species generated in a plasma.

In some embodiments a thermal ALD process is used for depositing a conductive fluoride film and the N-precursor is ammonia or $N_2H_4$. In some embodiments a plasma ALD process is used and the N-precursor for depositing a conductive, fluoride-containing film comprises nitrogen atoms, nitrogen-containing plasma, or nitrogen radicals.

Specific process conditions and parameters are provided below for deposition of exemplary conductive thin films comprising $TiF_3$ and fluorine-containing TiWN films, though the process conditions described with respect to these processes can be applied to the deposition of other conductive films comprising fluoride.

In some embodiments, the first and second deposition sub-cycles are performed at same reaction temperature. In some embodiments the deposition temperature for one or both of the metal fluoride and reducing sub-cycles is about 100° C. to about 700° C., about 200° C. to about 500° C., about 250° C. to about 400° C., or about 325° C. to about 375° C. In some embodiments both the $TiF_4$ and reducing sub-cycles are carried out at about 350° C.

In some embodiments the ratio of metal fluoride sub-cycles to reducing sub-cycles is selected to deposit a film that closes at very thin thicknesses, such as less than about 3 nm (where closed means that atoms of the underlying substrate are not detected at the outermost surface anymore, as determined, for example, by LEIS). In some embodiments the ratio of sub-cycles is selected such that the film is electrically continuous, i.e., conducts current at very thin thicknesses, such as less than about 3 nm, less than about 2 nm, less than about 1.5 nm, or even less than about 1.0 nm. In some embodiments the ratio of sub-cycles is selected such that the film is continuous as a layer, but may contain some non-continuous features, such as holes, in the continuous matrix at very thin thicknesses, such as less than about 3 nm, less than about 2 nm, less than about 1.5 nm, or even less than about 1.0 nm. In some embodiments the ratio of sub-cycles is selected such that the film is not closed and may not be continuous, but still acts as a diffusion barrier at very thin thicknesses, such as less than about 3 nm, less than about 2 nm, less than about 1.5 nm, or even less than about 1.0 nm.

In some embodiments, a conductive film comprising fluoride is deposited with an RMS roughness below about 2 nm, below about 1.5 nm, below about 1.0 nm, or even below about 0.7 nm, where the thickness is from about 20 to about 50 nm. However, in some embodiments the RMS roughness is below about 0.5 nm, below about 0.4 nm or even below about 0.3 nm for films with a thickness of less than about 10 nm. RMS roughness can be measured, for example, by x-ray reflectivity (XRR).

In some embodiments, increasing the relative number of reducing sub-cycles in each super-cycle increases the sheet resistance and/or resistivity of the metal fluoride film.

In some embodiments, a conductive fluoride-containing film formed according the present disclosure may have a sheet resistance of less than about 200,000 Ω/sq, less than about 140,000 Ω/sq, less than about 20,000 Ω/sq, less than about 10,000 Ω/sq, less than about 1,000 Ω/sq, or even less than about 1,000 Ω/sq.

In some embodiments, a conductive, fluoride-containing film formed according the present disclosure may have a layer resistivity of less than about $10^6$ μΩcm, less than about $10^5$ μΩcm, or less than about 50000 μΩcm.

In some embodiments, a conductive, fluoride-containing film formed according the present disclosure may have a layer resistivity of at least about 500 μΩcm, at least about 1,000 μΩcm, at least about 5,000 μΩcm, or even at least about 10,000 μΩcm In some embodiments, a film comprising metal fluoride formed according the present disclosure may have exhibit substantially no oxidation at temperatures below about 500° C., below about 400° C., below about 300° C., or below about 250° C. in an atmosphere containing oxygen. In some embodiments, the films are resistant to oxidation for prolonged periods in room temperature or temperatures naturally occurring outdoors, such as from about −50° C. to about 50° C., in oxygen containing atmospheres such as ambient air. For example, according to some embodiments, films formed according the present methods may be resistant to oxidation resistance for more than 6 hours, preferably more than 24 hours, and, in some cases, depending on the film composition, the films could be resistant to oxidation for periods of more than 10 days, preferably more than 30 days, and, in some cases, if desired, more than 1 year. Exposure to, for example, ambient air might occur in some particular applications, for example, in case the film comprising metal fluoride is used as protective layer against ambient air which can comprise also moisture/water. Other atmospheres containing oxygen could include oxygen atoms, plasma or radicals, ozone, water/moisture, or other species containing OH-groups.

Deposition of Films Comprising $TiF_3$ by ALD

As mentioned above, in some embodiments an atomic layer deposition process for depositing films comprising $TiF_3$, such as conductive films comprising a $TiF_x$ compound—such as $TiF_3$—may comprise multiple super-cycles, where each super-cycle comprises at least one $TiF_4$ sub-cycle and at least one reducing sub-cycle. In the $TiF_4$ sub-cycle the substrate is exposed to vapor phase $TiF_4$ such that up to a monolayer adsorbs on the substrate surface. In the reducing sub-cycle the substrate is exposed to a reducing agent, such as a silane or borane and a nitrogen reactant. The ratio of the $TiF_4$ and reducing sub-cycles can be varied to achieve the desired composition, and the number of super-cycles can be selected to deposit a titanium fluoride film of the desired thickness. The $TiF_4$ sub-cycle may precede the reducing sub-cycle and vice versa. Similarly, in the reducing cycle, the reducing agent may precede the nitrogen reactant and vice versa.

In some embodiments, the $TiF_4$ sub-cycle may include a reducing agent, such as a silane compound or a borane compound. And in some embodiments, the second sub-cycle does not include a silane or a borane compound.

The super-cycle can be written as:

a[b(titanium fluoride)+c(reducing agent+nitrogen reactant)], where (titanium fluoride) represents a $TiF_4$ sub-cycle and b is the number of $TiF_4$ sub-cycles in each super-cycle; (reducing agent+nitrogen reactant) represents a reducing sub-cycle and c is the number of reducing sub-cycles in each super-cycle; and a is the number of super-cycles. Although illustrated with the $TiF_4$ sub-cycle coming first in the super-cycle, in some embodiments, in one or more super-cycles, the reducing sub-cycle comes first. Thus in some embodiments the $TiF_4$ sub-cycle can be considered the first sub-cycle and the reducing sub-cycle can be considered the second sub-cycle, while in some embodiments the reducing sub-cycle can be considered the first sub-cycle and the $TiF_4$ sub-cycle can be considered the second sub-cycle.

Though, in some embodiments, the super-cycle can be written as:

a[b($TiF_4$+reducing agent)+c(nitrogen reactant)], where b is the number of $TiF_4$ sub-cycles—which includes a reducing agent—in each super-cycle; c is the number of nitrogen reactant sub-cycles in each super-cycle; and a is the number of super-cycles. The ratio of metal fluoride to nitrogen sub-cycles can be given as b:c.

In some embodiments the reducing agent can be a borane or silane, such as diborane, triborane, disilane, or trisilane. In some embodiments the reducing agent is disilane. In some embodiments the reducing agent is trisilane. In some embodiments the nitrogen reactant can be ammonia, $N_2H_4$, nitrogen atoms, nitrogen-containing plasma, or nitrogen radicals.

In some embodiments a super-cycle can be written as a[b($TiF_4$)+c($Si_2H_6$+$NH_3$)], where b is the number of $TiF_4$ sub-cycles in each super-cycle, c is the number of reducing sub-cycles in each super-cycle, and a is the number of super-cycles.

The ratio of $TiF_4$ to reducing sub-cycles can thus be given as b:c (or $TiF_4$:reducing). In some embodiments the ratio of sub-cycles is constant in each ALD super-cycle in the ALD process. In other embodiments the ratio of sub-cycles may be changed in one or more super-cycle. Unless indicated otherwise, when a ratio of sub-cycles is provided herein, it refers to the ratio of sub-cycles in a complete ALD process comprising multiple super-cycles.

In some embodiments, the first and second deposition sub-cycles are performed at same reaction temperature. In some embodiments the deposition temperature for one or both of the $TiF_4$ and reducing sub-cycles is about 100° C. to about 700° C., about 200° C. to about 500° C., about 250° C. to about 400° C., or about 325° C. to about 375° C. In some embodiments both the $TiF_4$ and reducing sub-cycles are carried out at about 350° C.

In some embodiments, the first and second sub-cycles are performed in the same reactor.

The first and second sub-cycles may be provided at a selected ratio to deposit a thin film with a desired composition and desired properties. For example, in some embodiments the ratio of the first, $TiF_4$ deposition sub-cycle to the second reducing sub-cycle in one or more ALD super-cycles may be from about 0.01 to about 100, about 0.05 to about 50 or about 0.1 to about 1. In some embodiments the ratio of $TiF_4$ deposition sub-cycles to reducing sub-cycles in one or more super-cycles is less than one. In some embodiments, the ratio of $TiF_4$ deposition sub-cycles to reducing sub-cycles in one or more super-cycles is between about 1 and about 3. In some embodiments the ratio of $TiF_4$ deposition sub-cycles to reducing sub-cycles in one or more super-cycles is between about 1 and about 50, between about 3 and about 30 or between about 5 and about 20. In some embodiments the ratio of $TiF_4$ deposition sub-cycles to reducing sub-cycles in one or more super-cycles is about 0.01, about 0.2, about 0.3, about 0.4, about 0.5, about 0.6, about 0.8 or about 1.

As mentioned above, the ratio of sub-cycles can be selected to achieve a desired composition and desired film properties. In some embodiments a greater percentage of the $TiF_4$ is converted to $TiF_3$ by increasing the number of reducing sub-cycles relative to the $TiF_4$ sub-cycles. In some embodiments the ratio of $TiF_4$ to reducing sub-cycles is increased to increase the sheet resistance and/or resistivity of the deposited film.

In some embodiments the ratio of first $TiF_4$ deposition sub-cycles to second reducing sub-cycles is the same in all of the complete ALD super-cycles performed in the ALD process. In other embodiments the specific ratio of first $TiF_4$ deposition sub-cycles to second reducing deposition sub-cycles can be varied in different complete ALD super-cycles. The specific ratios can be selected by the skilled artisan to provide the desired amounts of titanium, fluorine, nitrogen in the film and thus to achieve a film with the desired properties.

In some embodiments the film comprising $TiF_3$ that is deposited is a conductive film. In some embodiments a film comprising $TiF_3$ is deposited that has a greater oxidation resistance than a TiN film deposited by known vapor deposition processes that do not incorporate fluorine in the film, such as ALD (for example as measured at 300° C. in an air ambient).

In some embodiments a conductive film comprising $TiF_3$ is formed that comprises some silicon or boron from the reducing compound and some nitrogen from the nitrogen reactant. For example, in some embodiments a conductive film comprising $TiF_3$ is deposited that contains some Si and some N.

In some embodiments, a silane is used as a reducing agent and the film comprising $TiF_3$ also comprises a small amount of silicon. For example, in some embodiments, the silicon content may range from about 15 at %, preferably from about 0.01 to about 10 at %, more preferably from about 0.1 to about 5 at %, and most preferably from about 0.1 to about 2 at %. In some embodiments, the silicon content is preferably less than about 1.5 at %.

In some embodiments a borane is used as a reducing agent and the film comprising $TiF_3$ also comprises a small amount of boron. For example, in some embodiments, the boron content may range from less than about 15 at %, from about 0.01 to about 10 at %, from about 0.1 to about 5 at %, or from about 0.1 to about 2 at %. In some embodiments, the boron content is preferably less than about 1.5 at %.

In some embodiments, the films comprising $TiF_3$ also comprise a small amount of nitrogen. For example, in some embodiments, the nitrogen content may range from about 0.5 to about 50 at %, from about 1-20 at %, or from about 2 to about 15 at %.

In some embodiments, the films comprise fluorine in an amount greater than about 10 at %, preferably from about 20 to about 75 at %, from about 40 to about 70 at %, or from about 45 to about 65 at %.

In some embodiments the films comprising $TiF_3$ comprise less than about 1 at % oxygen.

FIG. 1 illustrates an ALD process for forming a film comprising $TiF_3$ on a substrate in a reaction chamber comprising multiple ALD super-cycles 100. Each super-cycle comprises a first $TiF_4$ deposition sub-cycle 200 and a second reducing sub-cycle 300. The super-cycle 100 is repeated as many times as desired to deposit a $TiF_3$ film of the desired thickness. The ratio between sub-cycles 200 and 300 within the super-cycle 100 may be selected to achieve a film with the desired composition and properties.

The first titanium fluoride deposition sub-cycle comprises:
  pulsing vaporized $TiF_x$, such as $TiF_4$, into the reaction chamber 210 to form at most a molecular monolayer of titanium fluoride on the substrate and
  purging the reaction chamber 220 to remove excess titanium fluoride and reaction by products, if any, and
  repeating 250 the pulsing and purging steps.

In some embodiments, the first deposition sub-cycle is repeated 1, 2, 3, 4, 5, 10, 20, 50, 100, or more times in succession. In some embodiments the first deposition sub-cycle is repeated no more than about 30-60 times consecutively, up to about 30 to 50 times consecutively, or up to about 40 times consecutively.

The atomic layer deposition super-cycle 100 for forming the $TiF_3$/TiN film also comprises one or more second reducing sub-cycles 300. In some embodiments, the second reducing sub-cycle 300 comprises:
  pulsing a vaporized reducing agent, such as disilane or trisilane, into the reaction chamber 310 to reduce at least some of the $TiF_4$ to $TiF_3$,
  purging the reaction chamber 320 to remove excess reducing agent and reaction by products, if any,
  providing a pulse of a nitrogen reactant, such as $NH_3$, into the reaction chamber 330, where the nitrogen reactant contributes at least some nitrogen to the titanium fluoride film,
  purging the reaction chamber 340 to remove excess nitrogen reactant and any gaseous by-products, and
  repeating 350 the pulsing and purging steps.

In some embodiments, the second reducing sub-cycle 300 is repeated 1, 2, 3, 4, 5, 10, 20, 50, 100 or more times in succession. In some embodiments the second reducing sub-cycle is repeated about 3 to 6 times, or about 5 times.

The first and second sub-cycles 200,300 are repeated multiple times in a complete ALD super-cycle 100, and the complete ALD super-cycle 100 is repeated to form a $TiF_3$ film of a desired thickness comprising a desired concentration of titanium, fluorine, and nitrogen.

In some embodiments, the number of times the first deposition sub-cycle 200 and second reducing sub-cycle 300 are repeated is the same in each complete ALD super-cycle 100. In other embodiments, the number of first and second sub-cycles 100, 200 varies in one or more complete ALD super-cycles 100. The number of first and second sub-cycles 100, 200 in each complete ALD super-cycle 100 and the total number of first and second sub-cycles 100, 200 and total ALD super-cycles 100 can be adjusted to achieve deposition of a $TiF_3$/TiN film of a desired thickness and composition.

Although illustrated as beginning with the first deposition sub-cycle 200, each complete ALD cycle may begin and end with either the first 100 or second 200 sub-cycle. For example, each ALD super-cycle for forming the $TiF_3$ film can be started with the first titanium fluoride deposition sub-cycle or the reducing sub-cycle. In some embodiments one or more super-cycles may begin with the reducing sub-cycle.

In some embodiments the film comprising $TiF_3$ is deposited by ALD over a substrate surface to form a conformal thin film of 500 nm or less. In some embodiments the thickness of the film is less than 100 nm, less than about 50 or less than about 10. Depending on the application the thickness could be much less, such as when used as a p-type capping layer or oxidation prevention layer, and the thickness of the film could be for example, from about 2 to about 50 Å, preferably from about 3 to about 30 Å and in some cases from about 5 to about 20 Å.

In some embodiments a film comprising $TiF_3$ is formed that only starts to oxidize in an oxygen or water/moisture-containing atmosphere, such as ambient air at temperatures above about 300° C.

In some embodiments a film comprising $TiF_3$ film is formed that has an n of about 1.6-1.8 and a k value of about 0.1-0.2.

Various modifications, omissions and additions may be made to the methods and structures described above without departing from the scope of the invention. All such modifications and changes are intended to fall within the scope of the invention, as defined by the appended claims.

reducing sub-cycle ratio (x/y) and film thicknesses were controlled by the number of super-cycles (z).

The films were characterized by four point probe measurements with CDE Resmap 168 for sheet resistance, x-ray reflectivity (XRR) with Brüker D8 Advance for thickness, roughness and density, by x-ray photoelectron spectroscopy (XPS) with PHI Quantum 2000 using monochromated $AlK_\alpha$ for composition (analysis done by EAG labs, East Windsor, N.J.), by secondary electron microscope (SEM) with Hitachi S-4800 field emission scanning electron microscope for morphology and conformality and by heated stage x-ray diffraction (XRD) with PANalytical X'Pert Pro MPD X-ray diffractometer with $CuK_\alpha$ radiation and HTK 1200 Anton Paar oven in nitrogen and air atmospheres for crystallographic phase evolution as a function of annealing temperature.

The ALD processes resulted in films that contained a surprising amount of fluorine. XPS and XRD analysis revealed the films to be a mixture of $TiF_3$ and TiN. The films were transparent and electrically conductive. Table 1 summarizes the composition, resistivity, roughness, density and growth rates of the processes with different $TiF_4$/reducing sub-cycle ratios.

TABLE 1

Rs and ellipsometry data of $TiF_4$ + $Si_2H_6$/$Si_3H_8$ + $NH_3$ with different pulsing ratios.

| | Sample | | | | | |
|---|---|---|---|---|---|---|
| | 1 | 2 | 3 | 4 | 5 | 6 |
| Reducing Agent | $Si_3H_8$ | $Si_3H_8$ | $Si_3H_8$ | $Si_2H_6$ | $Si_2H_6$ | $Si_2H_6$ |
| $TiF_4$/reducing sub-cycle ratio | 0.1 | 0.2 | 1 | 0.1 | 0.2 | 1 |
| $TiF_4$/($TiF_4$ + reducing) sub-cycle ratio | 0.09 | 0.17 | 0.50 | 0.09 | 0.17 | 0.50 |
| Sub-cycles | 440 | 360 | 400 | 440 | 360 | 400 |
| Super-cycles | 400 | 300 | 200 | 400 | 300 | 200 |
| Rs, Ω/sq (center point) | — | — | 141000 | 20200 | 217000 | 263 |
| Layer Resistivity, μΩcm (center point) | — | — | 696540 | 88314 | 911400 | 822 |
| Layer thickness, nm (3 mm EE, 21 points, average, ellipsometer) | 60.1 | 60.3 | 49.4 | 43.7 | 42.0 | 31.3 |
| Layer Th Uf (3 mm EE, 21 points, ellipsometer) | 10.6% | 6.9% | 17.2% | 13.6% | 14.4% | 13.9% |
| Layer RI (average, 21 points, ellipsometer) | 1.66 | 1.63 | 1.75 | 1.83 | 1.83 | 2.02 |
| N, at.-% | 8.6 | 8 | 5.5 | 12.7 | 9.9 | 0.6 |
| O, at.-% | 0.6 | 0.9 | 0.6 | 0.9 | 0.6 | 2.1 |
| F, at.-% | 59.3 | 60.6 | 65 | 55 | 58.6 | 15.7 |
| Si, at.-% | 2.3 | 1.6 | 0.4 | 1.6 | 1 | — |
| Ti, at.-% | 28.9 | 28.7 | 28.2 | 29.6 | 29.8 | 41.4 |

EXAMPLES

A number of $TiF_3$ films were deposited by ALD in a Pulsar® 2000 R&D reactor. The films were deposited with a super-cycle method using the following basic super-cycle, comprising a $TiF_4$ sub-cycle and a reducing sub-cycle: $z[x(TiF_4+y(Si_3H_8+NH_3)]$ and $z[x(TiF_4+y(Si_2H_6+NH_3)]$. The reactor temperature was 350° C.

The basic process parameters were: $TiF_4$; 3 second pulse/5 second purge, $NH_3$; 10 second pulse/5 second purge, $Si_2H_6$/$Si_3H_8$; 1 second pulse/5 second purge.

The films were deposited on silicon with native oxide. Film compositions were altered by changing the $TiF_4$/

Figure 2:
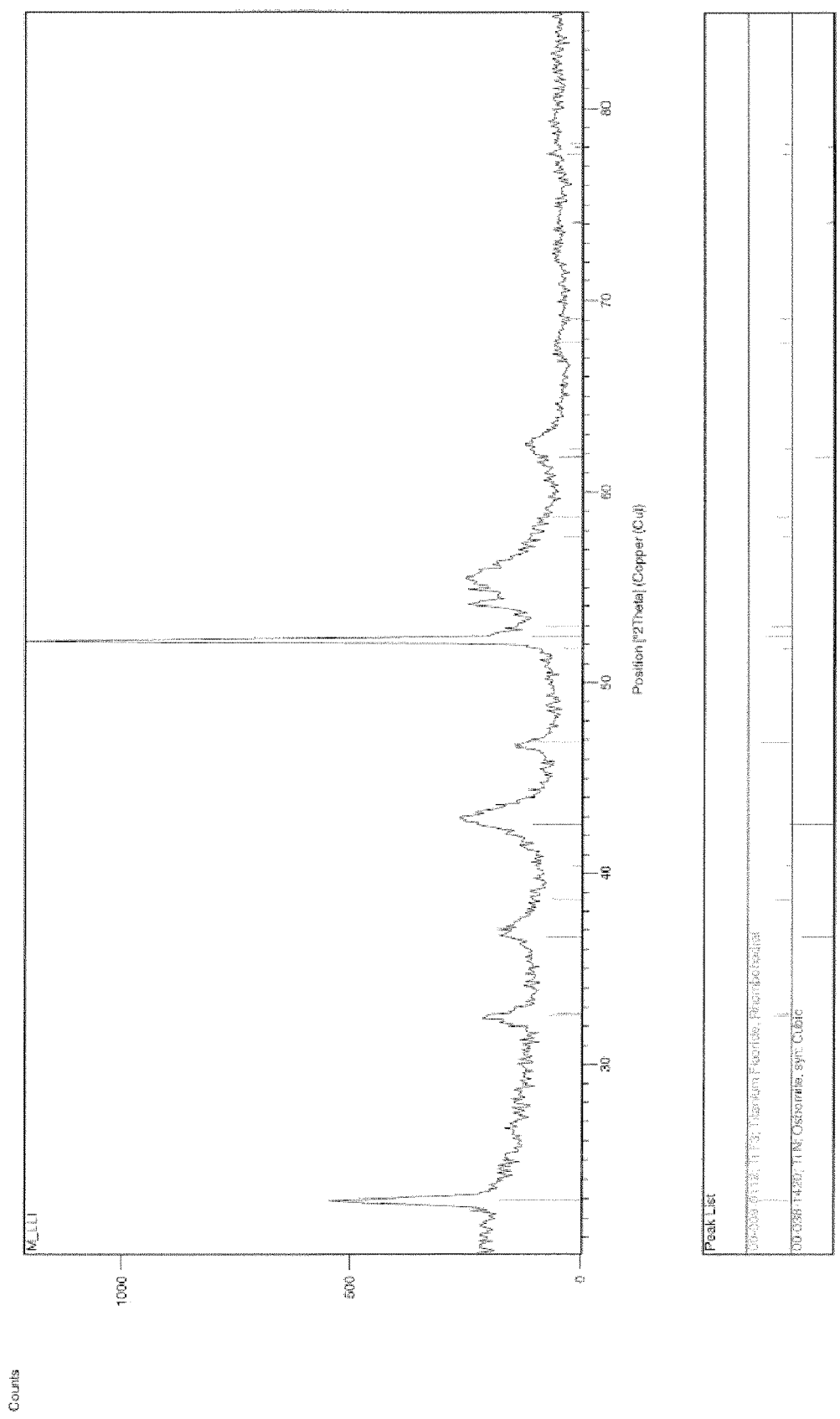
FIG. 2 shows the XRD pattern of a film formed according to one embodiment of the present disclosure.

FIG. 2 illustrates an XRD pattern of the film of sample 3 of this experiment using $Si_3H_8$ as the reducing agent.

Figure 3:
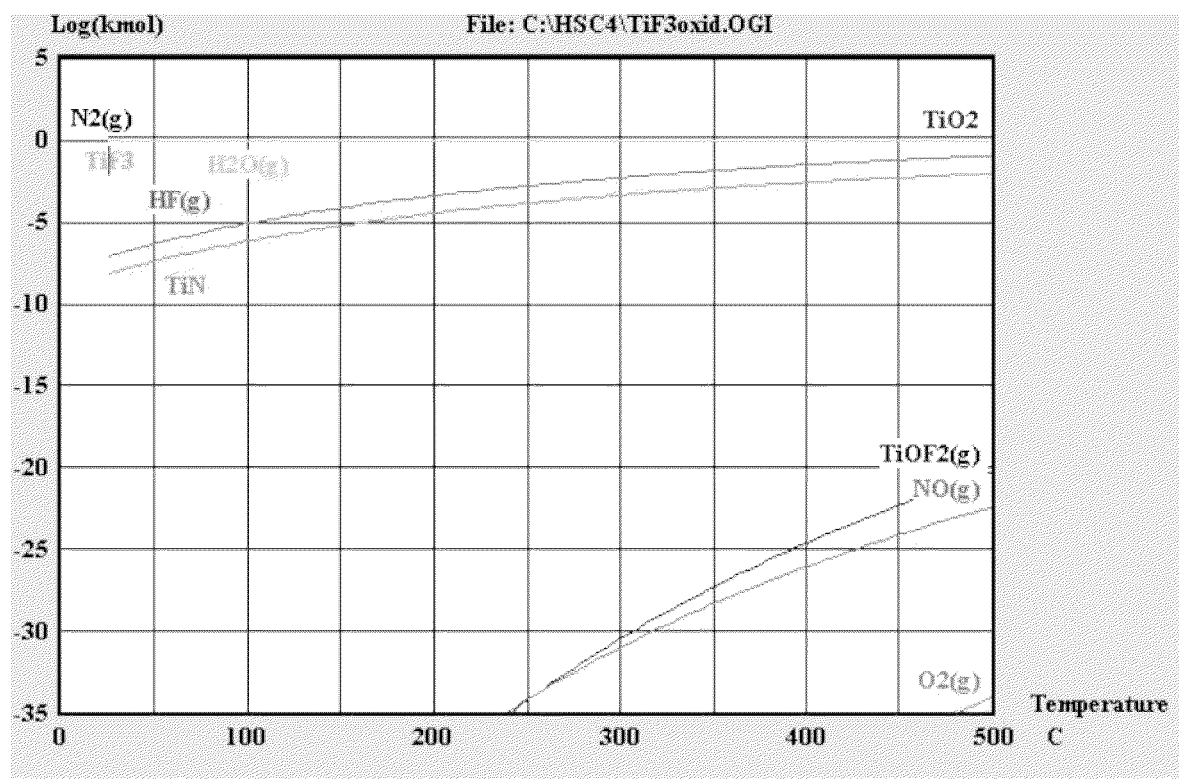
FIG. 3 is an analysis of the oxidation behavior of a film formed according to one embodiment of the present disclosure.

Films comprising $TiF_3$ were found to be much more resistant to oxidation than TiN. The $TiF_3$/TiN films formed in the present experiment contained less than about 1 at % oxygen. Thermodynamic equilibrium calculations showed that the $TiF_3$/TiN mixture oxidization proceeds in ambient air (i.e., $N_2$, $O_2$, and $H_2O$) such that TiN is first oxidized (FIG. 3).

Figure 4:
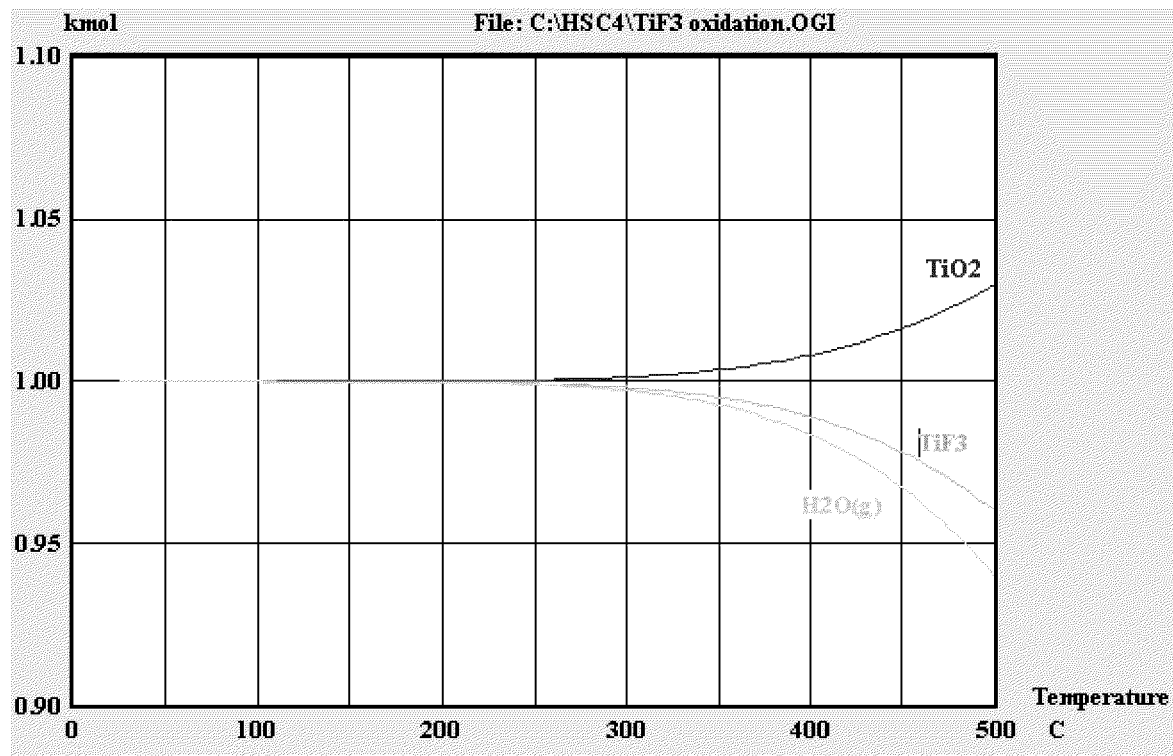
FIG. 4 is an additional analysis of the oxidation behavior of a film formed according to one embodiment of the present disclosure.

It was also determined that films comprising $TiF_3$ start to oxidize only at temperatures above 300° C. in an air ambient (FIG. 4). Without being tied to any particular theory, it is believed that because the Ti—F bond is stronger than the Ti—O bond, $TiF_3$ exhibits greater resistance to oxidation than does TiN. The TiF$_3$ is believed to have an n and k of about 1.6-1.8 and 0.1-0.2, respectively.

In a separate example, Ti$_x$W$_y$N$_z$ films were deposited by ALD in a Pulsar® 2000 R&D reactor. The films were deposited with a super-cycle method using the following basic binary chemistries for TiN and W: z[x(TiCl$_4$+NH$_3$)+y(Si$_2$H$_6$+WF$_6$)]. The reactor temperature was 350° C. The steady state flow rates for Si$_2$H$_6$ and WF$_6$ were 100 sccm, and 240 sccm for NH$_3$. TiCl$_4$ was filled in the liquid source, which was in vapor push mode at room temperature (21° C.) and used N$_2$ as the carrier gas.

The basic process parameters were: TiCl$_4$; 50 ms pulse/5 s purge, NH$_3$; 10 s pulse/5 s purge, Si$_2$H$_6$; 0.5 pulse/5 s purge and WF$_6$; 0.5 s pulse/5 s purge.

The films were deposited on 200 mm, 20 nm TiN/20 nm SiO$_2$/Si and 20 nm SiO$_2$/Si wafers and on 2 nm HfO$_2$/Si planar wafer pieces (≈10×10 cm) or on patterned native SiO$_2$/Si (≈5×5 cm) pieces for conformality. The pieces were placed on 200 mm adapter wafers during the deposition runs. Film compositions were altered by changing the TiN/W cycle ratio (x/y) and film thicknesses were controlled by the number of super-cycles (z).

The films were characterized by four point probe measurements with CDE Resmap 168 for sheet resistance, x-ray reflectivity (XRR) with Brüker D8 Advance for thickness, roughness and density, by x-ray photoelectron spectroscopy (XPS) with PHI Quantum 2000 using monochromated AlK$_\alpha$ for composition (analysis done by EAG labs, East Windsor, N.J.), by secondary electron microscope (SEM) with Hitachi S-4800 field emission scanning electron microscope for morphology and conformality and by heated stage x-ray diffraction (XRD) with PANalytical X'Pert Pro MPD X-ray diffractometer with CuK$_\alpha$ radiation and HTK 1200 Anton Paar oven in nitrogen and air atmospheres for crystallographic phase evolution as a function of annealing temperature.

Table 2 summarizes the composition, resistivity, roughness, density and growth rates of the TiN/W mixed process with different TiN/W cycle ratios. As can be seen in Table 2, the fluorine content of the films increases with increasing TiN/W cycle ratios and decreasing roughness.

film was W$_x$N$_y$ with less than 10 at % nitrogen and some silicon impurity. This may indicate that the TiN cycles in between the W cycles modified the nucleation behavior of W and resulted in lower growth rates and smoother films.

When the TiN/W cycle ratio was increased to ≥3, the films started to show a further increase in nitrogen content and a slow increase in titanium content with an increasing TiN/W cycle ratio. This suggested that when an adequate amount of TiN cycles was done before the W cycle, the Si$_2$H$_6$ and WF$_6$ was not able to remove all the titanium from the surface and therefore the titanium content of the films gradually started to increase.

The resistivity of the films first increased with increasing nitrogen content when the titanium content of the film was low, and then started to decrease again when the titanium content of the films was more than ≈20 at %.

Figure 5A:
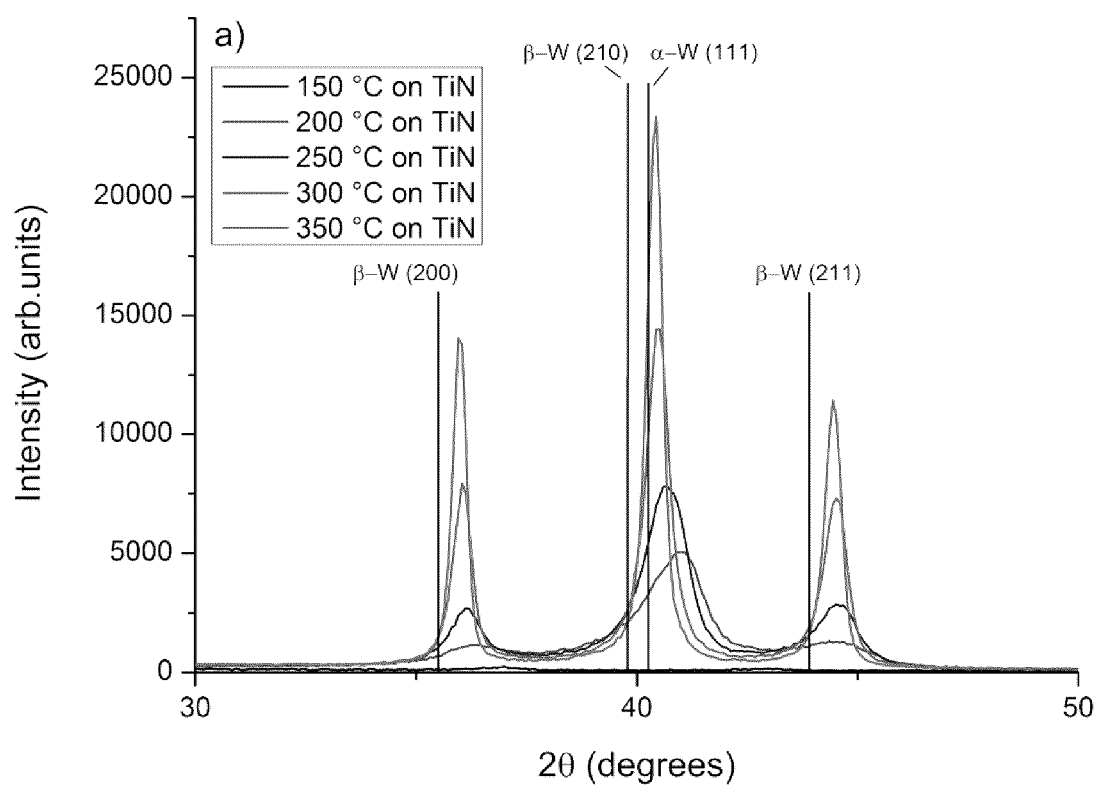
FIGS. 5A-C show XRD patterns of 100 cycles of pure ALD-W films deposited on TiN (FIG. 5A), $SiO_2$ (FIG. 5B) and $HfO_2$ (FIG. 5C) surfaces.
Figure 5B:
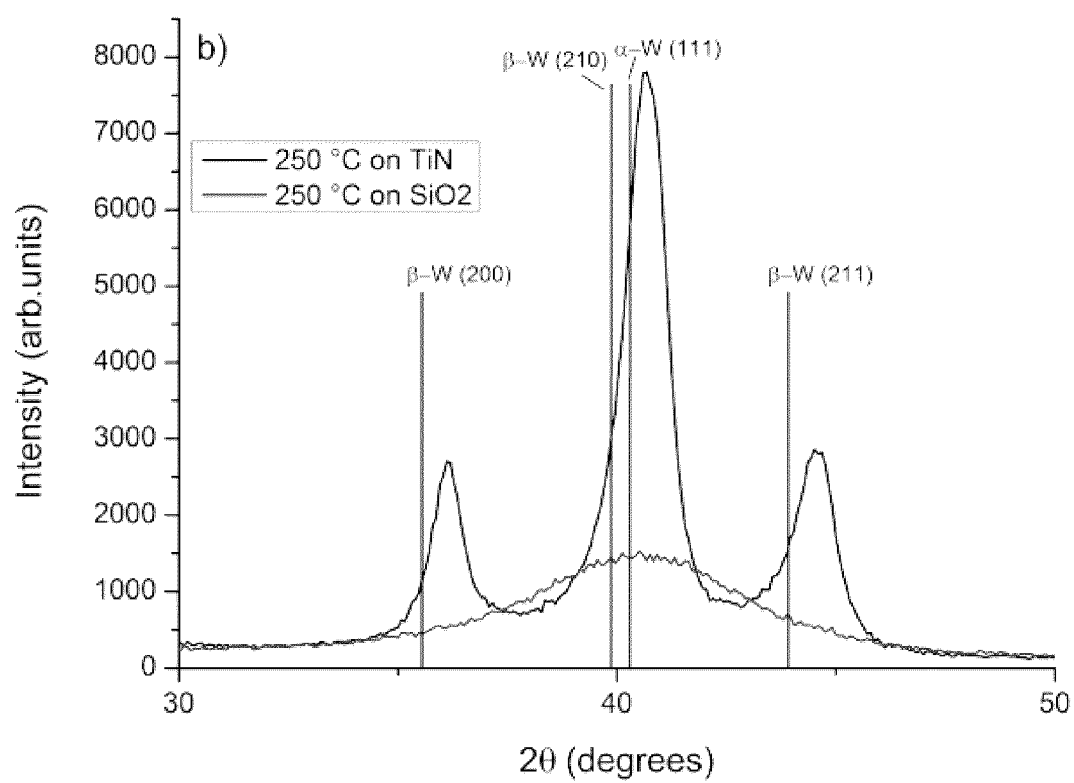
Figure 5C:
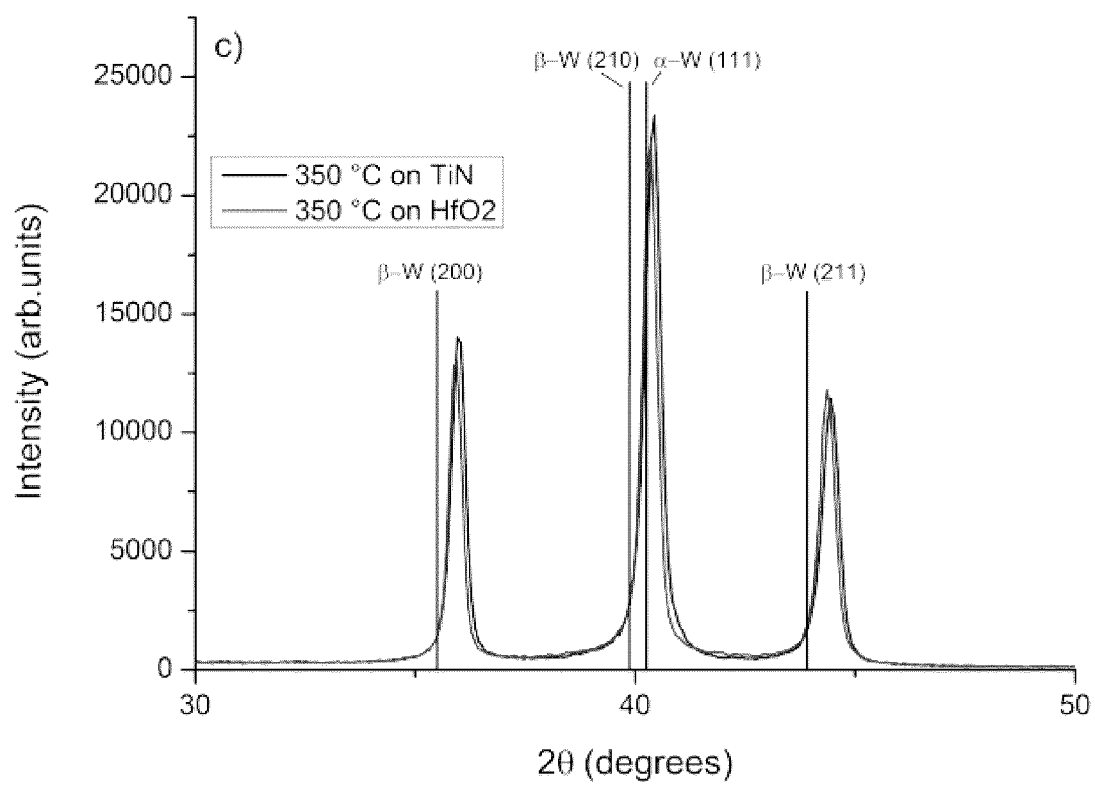

The crystallographic phases of the films were studied by x-ray diffraction analysis. Pure W films showed β-W crystal structure. The stabilization of the metastable β-W phase for the pure ALD tungsten has not been reported before. In order to determine whether the β-W stabilization is a general result of the ALD W process itself, or if it was stabilized by the HfO$_2$ substrate, the pure W process was also run on TiN and SiO$_2$ substrates. These results are presented in FIGS. 5A-C, which show XRD patterns of 100 cycles of pure ALD-W films deposited on TiN (FIG. 5A), SiO$_2$ (FIG. 5B) and HfO$_2$ (FIG. 5C) surfaces. The XRD peak shifts to higher 2Θ-values indicate that the films have residual tensile stress in all cases. The peak intensity increase in FIG. 5A is caused mainly by the increased grain size with higher deposition temperature and partly because of the higher growth rate with higher deposition temperature. At 150° C. there was no film growth on the TiN surface The TiN substrate was found to promote the stabilization of β-W crystal structure, whereas on SiO$_2$ substrates the resultant film seemed to be α-W with small crystallite size, as indicated by the wide XRD 2Θ peak at ≈40°. In all cases, the XRD 2Θ peaks were shifted to higher 2Θ values compared to the powder diffraction reference values, indicating that the tungsten film had tensile residual stress on all

TABLE 2

Properties of the ALD Ti$_x$W$_y$N$_z$ layers. The compositions reported in the table are the compositions of the films measured by XPS after sputtering with 2 keV Ar$^+$ ions until the surface carbon contamination in the signals was absent.

| TiN/W cycle ratio | TiN/ (TiN + W) cycle ratio | Layer Roughness, nm (RMS, XRR) | Layer Density, g/cm$^3$ (XRR) | Layer Resistivity, μΩcm | GR, Å/sub-cycle | N, at.-% | O, at.-% | F, at.-% | Si, at.-% | Ti, at.-% | W, at.-% |
|---|---|---|---|---|---|---|---|---|---|---|---|
| W | 0 | 4.15 | 17.3 | 122.2 | 6.26 | 0.5 | 1.3 | 0.3 | 3.0 | 0.1 | 94.8 |
| 0.5 | 0.33 | 2.14 | 16.5 | 187.8 | 2.24 | 8.5 | 0.5 | 0.3 | 2.0 | 0.0 | 88.7 |
| 1 | 0.50 | 0.65 | 16.1 | 173.6 | 0.78 | 9.6 | 0.7 | 0.0 | 0.9 | 0.1 | 88.7 |
| 3 | 0.75 | 1.15 | 12.5 | 622.3 | 0.77 | 21.0 | 0.6 | 3.0 | 1.0 | 3.1 | 71.4 |
| 5 | 0.83 | 1.96 | 11.9 | 711.4 | 0.63 | 25.7 | 0.4 | 3.0 | 1.2 | 7.2 | 62.4 |
| 20 | 0.95 | 1.01 | 8.6 | 553.7 | 0.33 | 39.9 | 0.3 | 2.3 | 0.5 | 24.9 | 32.0 |
| 40 | 0.98 | 0.65 | 7.8 | 381.6 | 0.30 | 44.0 | 0.6 | 1.6 | 0.8 | 32.2 | 20.8 |
| TiN | 1 | 2.74 | 5.3 | 143.1 | 0.24 | 53.2 | 0.8 | 0.0 | 0.2 | 45.7 | 0.0 |

Pure W films grew with a high growth rate of 6 Å/cycle, comparable to the growth rates reported in the literature on Al$_2$O$_3$. However, the roughness of the W film was also very high. Adding some TiN cycles in between the W cycles decreased the growth rate of the films and at the same time the roughness of the film was reduced substantially. Surprisingly though, the films did not contain any titanium when the TiN/W cycle ratio was ≤1. Instead, the resultant the surfaces. However, the shift was greater for the β-W on TiN and HfO$_2$ than for the α-W on SiO$_2$. The α-W to β-W transition may also partly explain the higher ALD growth rates (≈6 Å/cycle) for W observed on TiN and HfO$_2$ and what has also been reported in the literature on Al$_2$O$_3$, compared to the growth rates reported on SiO$_2$ (≈3 Å/cycle). β-W has a lattice parameter of 5.05 Å, whereas for α-W it is 3.16 Å.

Figure 6A:
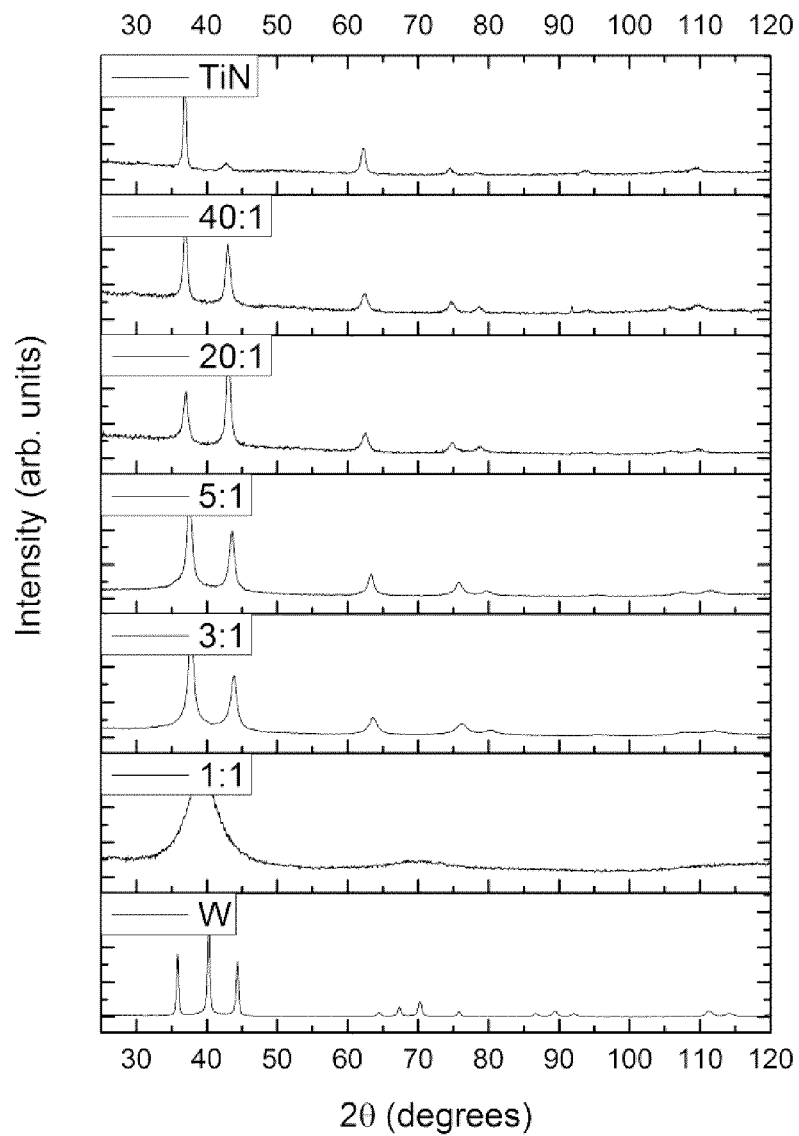
FIGS. 6A and B show XRD patterns of $Ti_xW_yN_z$ films deposited using different TiN/W cycle ratios.
Figure 6B:
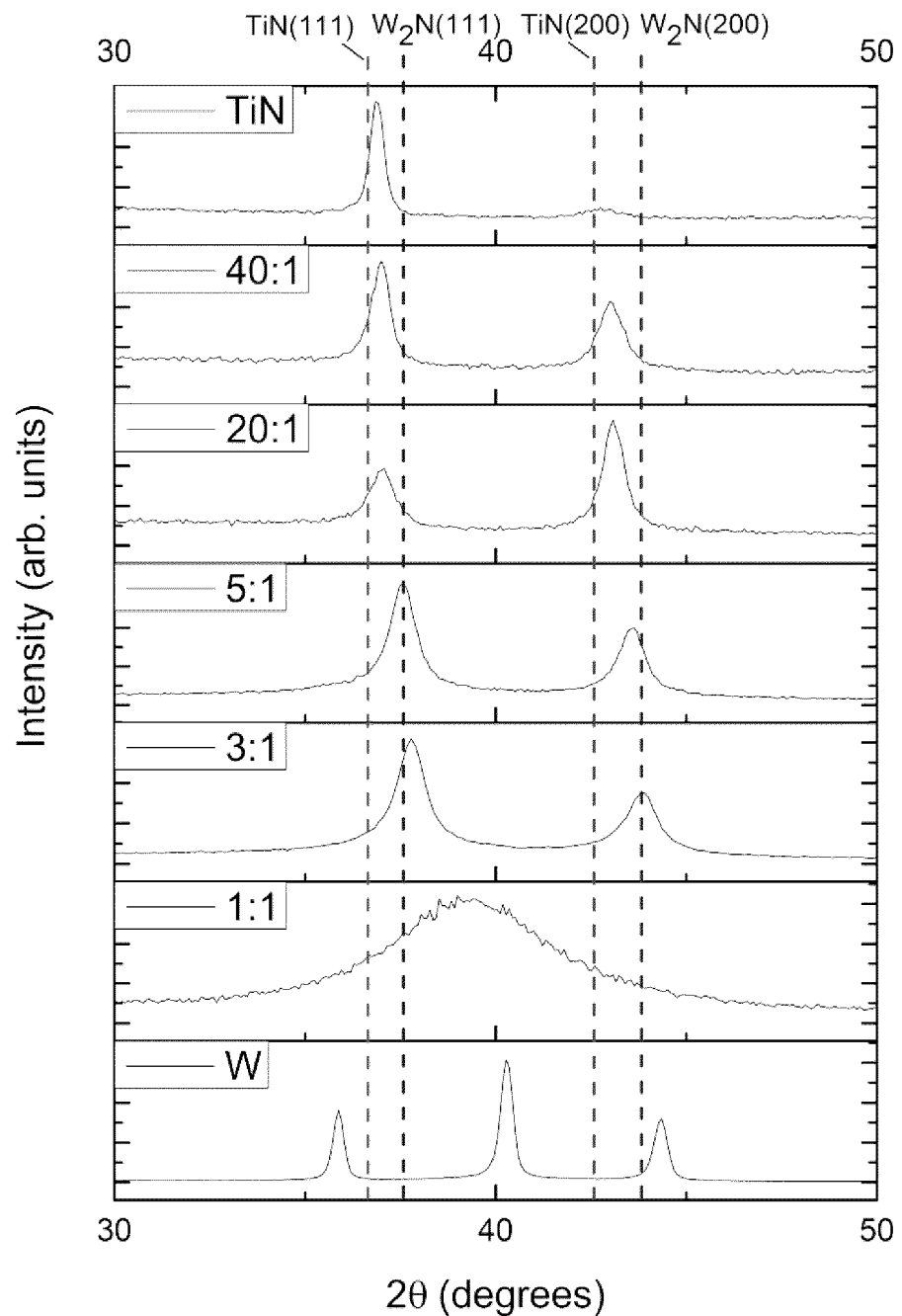

FIGS. 6A and B show the results for deposition of mixed $Ti_xW_yN_z$ films on $HfO_2$. With TiN/W cycle ratios of less than 3 the XRD analysis revealed two very wide peaks at 40 and 70°. These peaks could not be assigned to any of the compounds containing W and N in the XRD database; however their position matches the β-W peaks, so it is possible that these films still have the crystal structure of β-W, but have an extremely small crystallite size.

The $Ti_xW_yN_z$ films formed with TiN/W cycle ratios 3≤5 (Ti content 3≤7 at %) adapted the crystal structure of $W_2N$ with tungsten atoms randomly displaced by titanium atoms in the lattice. For TiN/W cycle ratios between 3 and 5, the $W_2N$ peaks in the $Ti_xW_yN_z$ films were visible, but with 2 theta values shifted in between the $W_2N$ and TiN peaks. Also the intensity ratios of the XRD peaks changed with the composition of the $Ti_xW_yN_z$ layer. This type of behavior in the XRD pattern is typical for a solid solution.

With larger TiN/W cycle ratios the XRD peaks are shifted closer to the TiN peaks. In the case of the films deposited similar thickness. FWHM was ≈0.7° for $Ti_{0.26}W_{0.33}N_{0.41}$ and ≈0.4° for TiN. This result suggests that the theoretically predicted high thermodynamic stability of the nanocrystalline phase in Ti—W alloys may be true also for the Ti—W—N system. Grain size estimated with the Debye-Sherrer method was about 20 nm for a 40 nm thick $Ti_{0.26}W_{0.33}N_{0.41}$ film.

Further testing was performed comparing the oxidation resistance achieved by TiWN thin films to that achieved by TiN films. Using an ALD process as disclosed herein, TiWN films were grown producing nanocrystalline metallic films with higher oxidation resistance than achieved with ALD-deposited TiN films. In particular, the TiWN films were deposited by ALD from x sub-cycles of $TiCl_4$ and $NH_3$ and y sub-cycles of $Si_2H_6$ and $WF_6$. Table 3 below illustrates the oxidation resistance of TiWN thin films deposited with a cycle ratio of 20:1 (x:y) and 40:1 (x:y), compared to the oxidation resistance of pure TiN films at the same three nominal thicknesses.

TABLE 3

Rs before and after oxidation of thin TiWN and TiN films

| Material | Nominal thickness (nm) | XRR thickness as deposited (nm) | Rs as deposited (Ω/sq) | Rs after $O_3$ exposure* (Ω/sq) | Rs after $O_3$ exposure** (Ω/sq) | Estimated oxide thickness after $O_3$ exposure* (nm) | Estimated oxide thickness after $O_3$ exposure** (nm) |
|---|---|---|---|---|---|---|---|
| TiN | 5.0 | 5.1 | 468 | N/A | N/A | 5.1 | 5.1 |
|  | 7.0 | 7.1 | 232 | N/A | N/A | 7.1 | 7.1 |
|  | 9.0 | 9.1 | 152 | 4305 | N/A | 8.8 | 9.1 |
| TiWN 20:1 | 5.0 | 5.2 | 2063 | N/A | N/A | 5.2 | 5.2 |
|  | 7.0 | 7.2 | 1197 | 220000 | N/A | 7.2 | 7.2 |
|  | 9.0 | 8.7 | 900 | 2384 | 24985 | 5.4 | 8.4 |
| TiWN 40:1 | 5.0 | 5.3 | 1377 | N/A | N/A | 5.3 | 5.3 |
|  | 7.0 | 7.8 | 710 | 1643000 | N/A | 7.8 | 7.8 |
|  | 9.0 | 8.8 | 584 | 2874 | 120000 | 7.0 | 8.8 |

*$O_3$ exposure conditions: 250 g/Nm³, 500 sccm, 400° C., 15 min.
**$O_3$ exposure conditions: 250 g/Nm³, 500 sccm, 400° C., 30 min.

using TiN/W cycle ratios ≥20 (Ti content≥25 at %), the films adapt the crystal structure of TiN with titanium atoms randomly displaced by tungsten atoms in the lattice.

Figure 7:
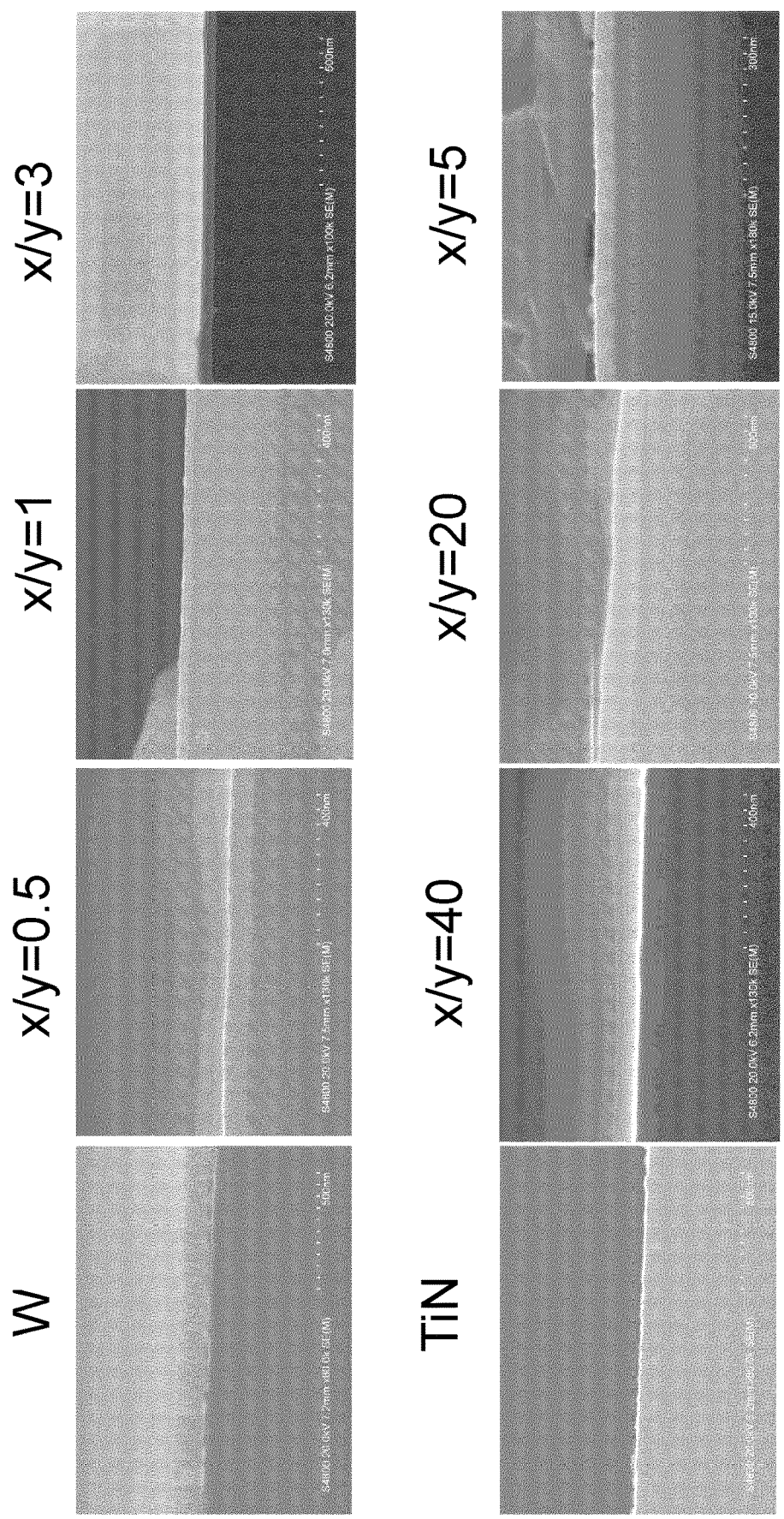
FIG. 7 shows a comparison of the morphology of $W_xN_y$ and $Ti_xW_yN_z$ layers deposited with various ratios of TiN to W deposition cycles, as well as pure W and TiN.

Both $W_xN_y$ and $Ti_xW_yN_z$ films exhibited substantially wider XRD peaks than pure W or TiN films with comparable thicknesses. The grain size estimated with the Debye-Scherrer method was ≈2 nm for $W_{0.9}N_{0.1}$ (1:1 TiN/W cycle ratio) and ≈20 nm for $Ti_{0.26}W_{0.33}N_{0.41}$ (20:1 TiN/W cycle ratio) film. FIG. 7 presents a comparison of the morphology of the $W_xN_y$ and $Ti_xW_yN_z$ layers deposited at various TiN:W sub-cycle ratios, along with pure W and TiN. The columnar grain structure clearly visible in pure W and TiN films is absent in the SEM images of the mixed process films. This confirms that the smooth film surfaces modeled in the XRR analysis and the wide peaks in the XRD patterns are a consequence of the nanocrystalline phase of the mixed process films with no visible grain morphology in the SEM analysis.

Figure 8:
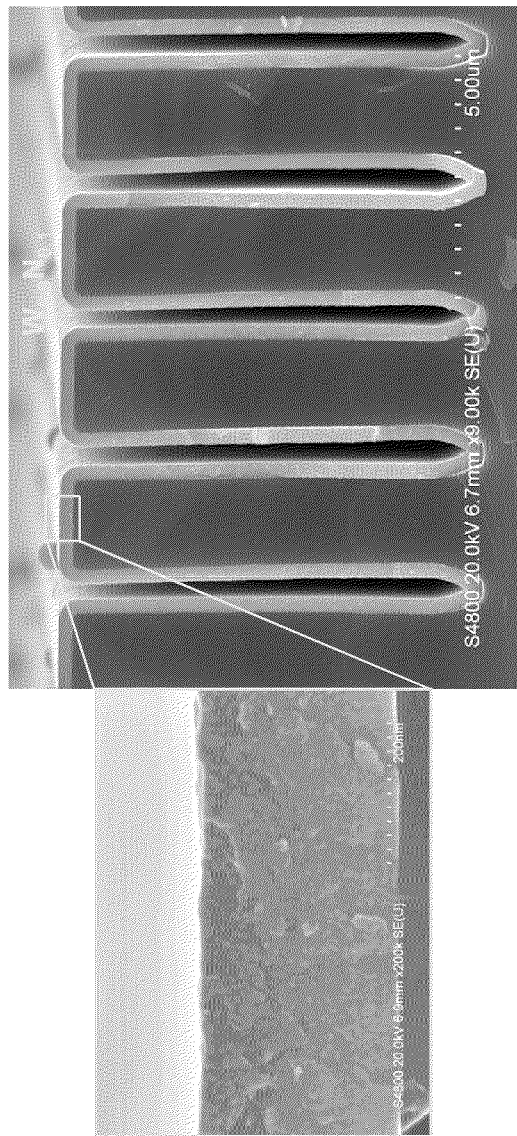
FIG. 8 shows SEM images of a $W_{0.9}N_{0.1}$ (TiN/W cycle ratio=1) film deposited in a 3D trench structure. The grain size was too small to be detected with SEM. The conformality and step coverage of the film appears to be excellent.

FIG. 8 presents a SEM image of a $W_{0.9}N_{0.1}$ (1:1 TiN/W cycle ratio) film in a 3D trench structure. The true ALD nature in the growth of the film is evident within the trench, showing constant film thickness inside the trench even though the trench width increased with its depth.

Figure 9A:
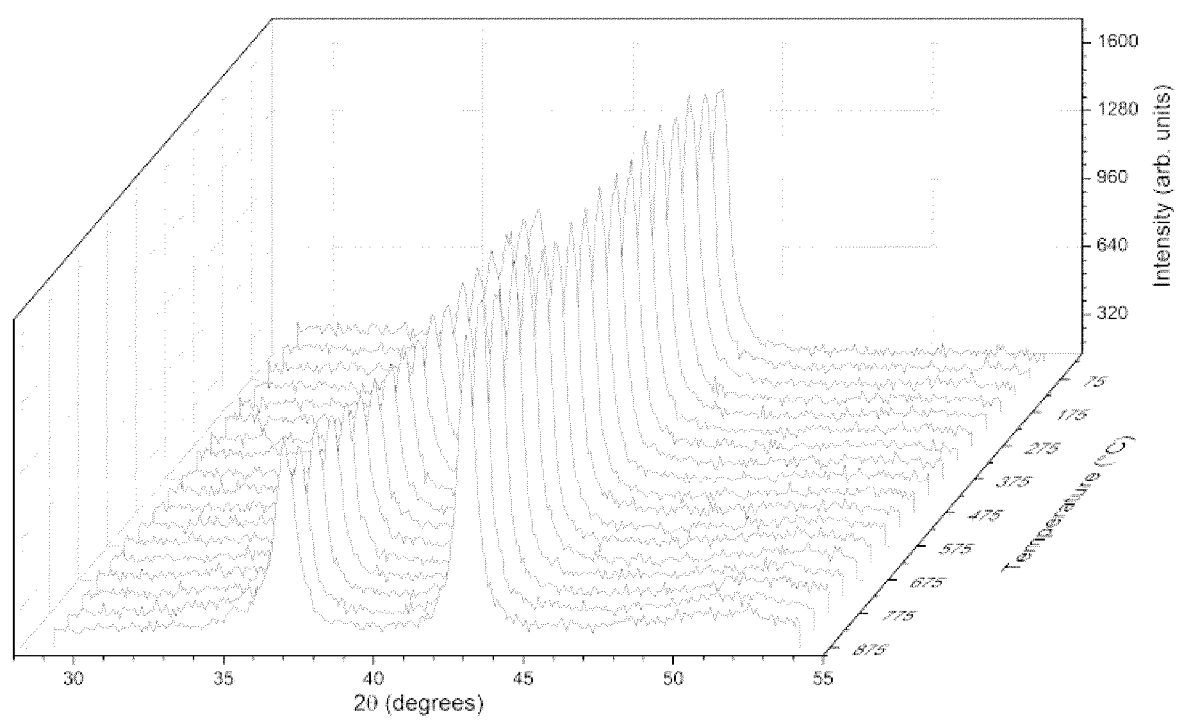
FIGS. 9A and B show heated stage XRD patterns of a $Ti_{0.26}W_{0.33}N_{0.41}$ (20:1 TiN/W cycle ratio) film in nitrogen atmosphere. No signs of grain coarsening with heating up to 875° C. are seen.
Figure 9B:
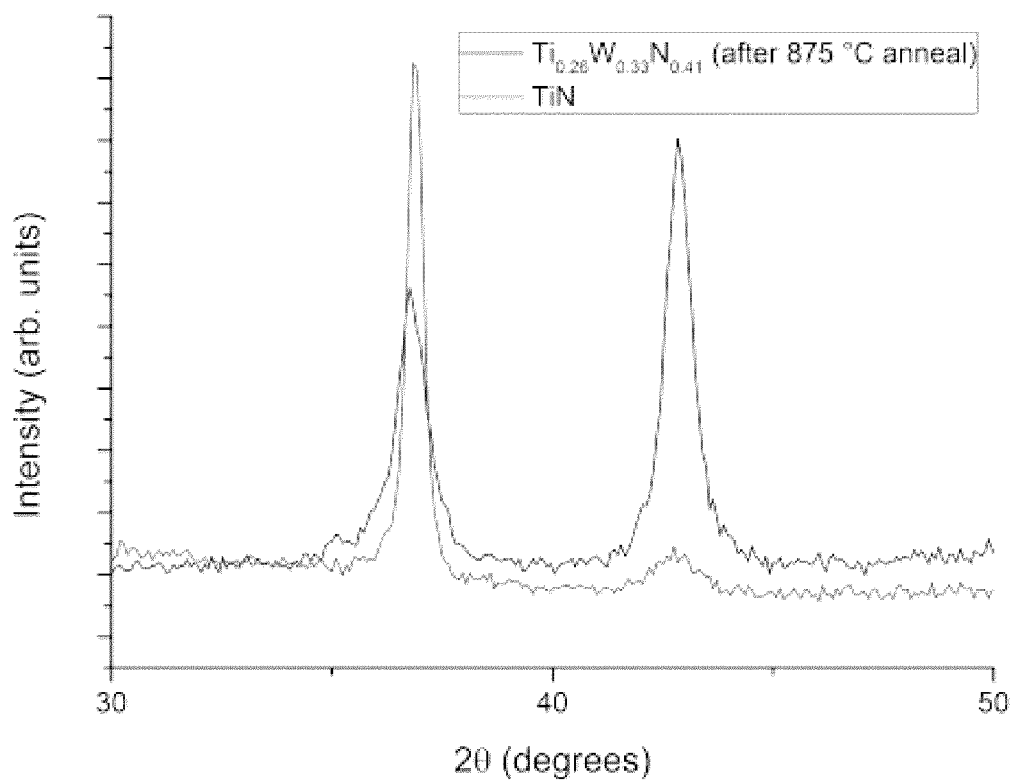
FIG. 9B shows a comparison of the film with a pure TiN film having a similar thickness.

The stability and oxidation resistance of the nanocrystalline phase of a ternary $Ti_xW_yN_z$ film with a composition of $Ti_{0.26}W_{0.33}N_{0.41}$ (20:1 TiN/W cycle ratio) was studied by heated stage XRD. In nitrogen atmosphere the nanocrystalline phase was stable at up to 875° C. with no sign of grain coarsening during the heating cycles as shown in FIG. 9A. FIG. 9B shows a comparison with a pure TiN film with a It can be seen that TiWN oxidizes slower than TiN. Without being restricted to any particular theory, this is believed to be caused by the more nanocyrstalline structure of the TiWN films compared to TiN. Because the TiWN films exhibits no columnar structure, they experience slower oxygen diffusion inside the film. Additionally, the fluorine content in the TiWN films resists diffusion of oxygen. The surface of the TiWN films is enriched in fluorine compared to the bulk of the film. And the oxidation of the fluoride (i.e., $2TiF_3+2O_2 \rightarrow 2TiO_2+F_2$) is a thermodynamically unfavorable reaction.

Although certain embodiments and examples have been discussed, it will be understood by those skilled in the art that the scope of the claims extend beyond the specifically disclosed embodiments to other alternative embodiments and/or uses and obvious modifications and equivalents thereof.

We claim:

1. A continuous fluoride thin film comprising $TiF_3$ and TiN and having a resistivity of less than $10^6$ μΩcm.

2. The thin film of claim 1, wherein the thin film comprises about 5 to about 40 at % nitrogen.

3. The thin film of claim 1, wherein the thin film has a thickness of less than about 100 nm.

4. The thin film of claim 1, wherein the thin film is deposited by a vapor deposition process.

5. The thin film of claim 4, wherein the vapor deposition process is an atomic layer deposition (ALD) process.

6. The thin film of claim 4, wherein the vapor deposition process is a chemical vapor deposition (CVD) process.

7. The thin film of claim 1, wherein the thin film has a resistivity of from about 500 μΩcm to about $10^5$ μΩcm.

8. The thin film of claim 1, wherein the thin film has a resistivity of from about 5,000 μΩcm to about 50,000 μΩcm.

9. The thin film of claim 1, wherein the thin film comprises more than about 10 at % fluorine.

10. The thin film of claim 9, wherein the thin film comprises about 20 to about 75 at % fluorine.

11. The thin film of claim 9, wherein the thin film has a ratio of a concentration of fluorine to a concentration of titanium from about 0.25 to about 5.

12. The thin film of claim 1, wherein the thin film does not comprise more than about 20 at % of metals other than titanium.

13. The thin film of claim 1, wherein the thin film comprises less than about 2.5 at % oxygen.

14. The thin film of claim 1, wherein the thin film is not a nanolaminate film and separate layers of metal fluoride and metal nitride are not observable.

15. The thin film of claim 1, wherein the thin film does not comprise a columnar grain structure.

16. The thin film of claim 1, wherein the thin film has a root mean squared (RMS) surface roughness of below about 2 nm.

17. The thin film claim of 4, wherein the vapor deposition process includes two or more reactants.

18. The thin film claim of 17, wherein the vapor deposition process includes three or more reactants.

* * * * *

UNITED STATES PATENT AND TRADEMARK OFFICE
CERTIFICATE OF CORRECTION

PATENT NO. : 10,643,925 B2
APPLICATION NO. : 14/255799
DATED : May 5, 2020
INVENTOR(S) : Tom E. Blomberg et al.

It is certified that error appears in the above-identified patent and that said Letters Patent is hereby corrected as shown below:

On the Title Page

On Page 3, Column 2, Item (56), under Other Publications, Line 50, delete "Zeitscrift" and insert --Zeitschrift--.

In the Specification

In Column 20, Line 34, delete "surface" and insert --surface.--.

In Column 22, Line 40, delete "nanocyrstalline" and insert --nanocrystalline--.

In the Claims

In Column 23, Line 27, Claim 17, delete "claim of" and insert --of claim--.

In Column 23, Line 29, Claim 18, delete "claim of" and insert --of claim--.

Signed and Sealed this
Fourth Day of August, 2020

Andrei Iancu
*Director of the United States Patent and Trademark Office*